United States Patent
Chu et al.

(10) Patent No.: US 10,910,350 B2
(45) Date of Patent: Feb. 2, 2021

(54) STRUCTURE OF A SEMICONDUCTOR ARRAY

(71) Applicant: HIPHOTON CO., LTD., Hsinchu (TW)

(72) Inventors: Chen-Fu Chu, Hsinchu (TW); Chen-Hsien Chu, Hsinchu (TW)

(*) Notice: Subject to any disclaimer, the term of this patent is extended or adjusted under 35 U.S.C. 154(b) by 0 days.

(21) Appl. No.: 14/720,316

(22) Filed: May 22, 2015

(65) Prior Publication Data

US 2015/0340346 A1 Nov. 26, 2015

Related U.S. Application Data

(60) Provisional application No. 62/009,251, filed on Jun. 8, 2014, provisional application No. 62/009,250, filed on Jun. 8, 2014, provisional application No. 62/002,851, filed on May 24, 2014.

(51) Int. Cl.

| | | |
|---|---|---|
| *H01L 25/075* | (2006.01) | |
| *H01L 33/50* | (2010.01) | |
| *H01L 23/00* | (2006.01) | |
| *H01L 33/44* | (2010.01) | |
| *H01L 33/54* | (2010.01) | |

(52) U.S. Cl.
CPC .......... *H01L 25/0753* (2013.01); *H01L 24/97* (2013.01); *H01L 33/50* (2013.01); *H01L 33/44* (2013.01); *H01L 33/504* (2013.01); *H01L 33/54* (2013.01); *H01L 2224/16225* (2013.01); *H01L 2924/13091* (2013.01); *H01L 2924/181* (2013.01)

(58) Field of Classification Search
CPC ..... H01L 25/0753; H01L 24/97; H01L 33/50; H01L 2924/181; H01L 2224/16225; H01L 33/504; H01L 33/54; H01L 33/44
USPC .......................................................... 257/89
See application file for complete search history.

(56) References Cited

U.S. PATENT DOCUMENTS

| | | | | |
|---|---|---|---|---|
| 5,742,129 A * | 4/1998 | Nagayama | .......... | H01L 27/3211 313/498 |
| 7,453,208 B2 * | 11/2008 | Lin | ........................ | H01J 9/242 313/238 |
| 8,183,072 B2 * | 5/2012 | Seo | ........................ | H01L 33/007 257/96 |
| 8,211,724 B2 * | 7/2012 | Kim | ........................ | H01L 27/153 257/96 |
| 8,232,571 B2 * | 7/2012 | Seo | ........................ | H01L 27/153 257/96 |
| 9,136,475 B2 * | 9/2015 | Okumoto | ............ | H01L 51/0007 |
| 9,209,348 B2 * | 12/2015 | Hu | ........................ | H01L 3/08 |
| 9,269,878 B2 * | 2/2016 | Hwang | ................... | H01L 33/385 |
| 9,564,422 B2 * | 2/2017 | Jeong | ................... | H01L 25/0753 |
| 9,722,143 B2 * | 8/2017 | Tomizawa | ............ | H01L 33/40 |
| 9,843,010 B2 * | 12/2017 | Nishiyama | .......... | H01L 51/5088 |

(Continued)

Primary Examiner — Mohammad M Hoque
(74) Attorney, Agent, or Firm — Jongkook Park

(57) ABSTRACT

A structure of a semiconductor array comprises multiple semiconductor units, an isolation layer and a decomposed or buffer unit. Multiple semiconductor units combined the semiconductor array. The isolation layer coated each semiconductor unit. The decomposed or buffer unit coated the isolation layer and filled between each semiconductor unit to enhance structure of the semiconductor units. Wherein, the isolation layer protected by edge of the semiconductor units and the decomposed or buffer unit.

7 Claims, 18 Drawing Sheets

(56) References Cited

U.S. PATENT DOCUMENTS

| | | | | |
|---|---|---|---|---|
| 9,893,118 B2* | 2/2018 | Kim | | H01L 27/156 |
| 9,985,172 B2* | 5/2018 | Lee | | H01L 33/22 |
| 2002/0060518 A1* | 5/2002 | Duineveld | | H01L 51/0003 |
| | | | | 313/506 |
| 2002/0158835 A1* | 10/2002 | Kobayashi | | H01L 51/5218 |
| | | | | 345/100 |
| 2003/0011377 A1* | 1/2003 | Oohata | | G09G 3/006 |
| | | | | 324/512 |
| 2003/0081159 A1* | 5/2003 | Ha | | G02F 1/133555 |
| | | | | 349/113 |
| 2004/0017152 A1* | 1/2004 | Hashimoto | | H01L 51/5268 |
| | | | | 313/505 |
| 2004/0119066 A1* | 6/2004 | Han | | H01L 51/0005 |
| | | | | 257/40 |
| 2006/0119258 A1* | 6/2006 | Sakata | | H01L 51/5092 |
| | | | | 313/504 |
| 2006/0169994 A1* | 8/2006 | Tu | | H01L 33/385 |
| | | | | 257/89 |
| 2007/0046185 A1* | 3/2007 | Kim | | H01L 27/3216 |
| | | | | 313/504 |
| 2007/0066179 A1* | 3/2007 | Nakamura | | B41J 2/14 |
| | | | | 445/46 |
| 2007/0132356 A1* | 6/2007 | Hashimoto | | H01L 27/3283 |
| | | | | 313/292 |
| 2007/0159089 A1* | 7/2007 | Oh | | H01L 27/3246 |
| | | | | 313/506 |
| 2007/0200488 A1* | 8/2007 | Ito | | F21K 2/06 |
| | | | | 313/500 |
| 2007/0228937 A1* | 10/2007 | Akiyoshi | | H01L 27/3246 |
| | | | | 313/503 |
| 2007/0241998 A1* | 10/2007 | Fish | | G09G 3/3233 |
| | | | | 345/76 |
| 2007/0252518 A1* | 11/2007 | Lee | | H01L 27/3283 |
| | | | | 313/504 |
| 2008/0018231 A1* | 1/2008 | Hirakata | | H01L 51/5246 |
| | | | | 313/498 |
| 2008/0070466 A1* | 3/2008 | Chu | | H01L 27/3244 |
| | | | | 445/24 |
| 2008/0087902 A1* | 4/2008 | Lee | | H01L 27/153 |
| | | | | 257/88 |
| 2008/0210954 A1* | 9/2008 | Lee | | H01L 27/153 |
| | | | | 257/88 |
| 2009/0008667 A1* | 1/2009 | Fujii | | H01L 51/0005 |
| | | | | 257/98 |
| 2009/0039359 A1* | 2/2009 | Yoon | | H01L 33/382 |
| | | | | 257/88 |
| 2009/0160322 A1* | 6/2009 | Yoshida | | H01L 27/3246 |
| | | | | 313/504 |
| 2009/0224664 A1* | 9/2009 | Yoshida | | H01L 51/0545 |
| | | | | 313/504 |
| 2009/0284135 A1* | 11/2009 | Yoshida | | H01L 27/3283 |
| | | | | 313/504 |
| 2010/0032692 A1* | 2/2010 | Lee | | H01L 25/0753 |
| | | | | 257/88 |
| 2010/0072905 A1* | 3/2010 | Kim | | H05B 33/0821 |
| | | | | 315/192 |
| 2010/0078656 A1* | 4/2010 | Seo | | H01L 27/156 |
| | | | | 257/88 |
| 2010/0188022 A1* | 7/2010 | Gerlach | | H05B 33/0866 |
| | | | | 315/312 |
| 2012/0074441 A1* | 3/2012 | Seo | | H01L 27/153 |
| | | | | 257/91 |
| 2012/0193653 A1* | 8/2012 | Horng | | H01L 25/0753 |
| | | | | 257/88 |
| 2012/0217605 A1* | 8/2012 | Kunikiyo | | H01L 27/14603 |
| | | | | 257/443 |
| 2012/0241793 A1* | 9/2012 | In | | H01L 33/486 |
| | | | | 257/98 |
| 2013/0026518 A1* | 1/2013 | Suh | | H01L 33/44 |
| | | | | 257/98 |
| 2013/0038921 A1* | 2/2013 | Kim | | G02F 1/1677 |
| | | | | 359/296 |
| 2013/0264600 A1* | 10/2013 | Lee | | H01L 33/005 |
| | | | | 257/98 |
| 2014/0162178 A1* | 6/2014 | Na | | G03F 7/0045 |
| | | | | 430/7 |
| 2014/0197396 A1* | 7/2014 | Madigan | | H01L 27/3246 |
| | | | | 257/40 |
| 2014/0306198 A1* | 10/2014 | Im | | H01L 27/3216 |
| | | | | 257/40 |
| 2014/0339521 A1* | 11/2014 | Ozawa | | H01L 51/5228 |
| | | | | 257/40 |
| 2015/0009649 A1* | 1/2015 | Jagt | | H01L 33/507 |
| | | | | 362/84 |
| 2015/0015840 A1* | 1/2015 | Imanishi | | G02F 1/13394 |
| | | | | 349/123 |
| 2015/0187740 A1* | 7/2015 | McGroddy | | H01L 24/75 |
| | | | | 345/82 |
| 2016/0172423 A1* | 6/2016 | Nendai | | H01L 51/0005 |
| | | | | 257/40 |
| 2016/0218143 A1* | 7/2016 | Chaji | | H01L 27/156 |
| 2017/0117339 A1* | 4/2017 | Takata | | H01L 27/3246 |
| 2017/0162831 A1* | 6/2017 | Ito | | F26B 11/18 |

* cited by examiner

US 10,910,350 B2

STRUCTURE OF A SEMICONDUCTOR ARRAY

This application claims benefit of U.S. provisional applications No. 62/002,851 filed on May 24, 2015, No. 62/009,250 filed on Jun. 8, 2015 and No. 62/009,251 filed on Jun. 8, 2015 under 35 U.S.C. § 119(e); the entire contents of which are hereby incorporated by reference.

BACKGROUND OF THE INVENTION

Field of the Invention

This invention relates a structure of a semiconductor array, and more particularly to a structure of filling with a polymer in a street between semiconductor units.

Related Art

There are many known semiconductor substrate removal technologies. These technologies include mechanical grinding removal, planer removal, chemical wet etching removal and laser irradiation the interfacial layer for removal. For removal of semiconductor chip array from their growth substrate to another carrier, the protection structure of the semiconductor chip array is a key to obtain high yield carrier transfer. More specifically, for the thin flexible display, there are many known display technologies such as the organic light emitting diode display, micro LED display. Recently, small size displays with high resolution for wearable electronic devices are getting more popular. Currently, most of small size high resolution display is fabricated by organic light emitting diode. The organic light emitting diode display is potentially used in many wearable electronic display, head mounted display, smart watch display, smart band display, and smart ring display.

SUMMARY OF THE INVENTION

The invention discloses a structure of a semiconductor array comprises multiple semiconductor units, an isolation layer and a decomposed or buffer unit. Multiple semiconductor units combined the semiconductor array. The isolation layer coated each semiconductor unit. The decomposed or buffer unit coated the isolation layer and filled between each semiconductor unit to enhance structure of the semiconductor units. Wherein, the isolation layer protected by edge of the semiconductor units and the decomposed or buffer unit.

In one embodiment of the present invention, the isolation layer and the polymer are provided to separate each single semiconductor light emitting unit. Two neighbor semiconductor light emitting unit structure could be separated by the isolation layer and the polymer. The light emitted from each semiconductor light emitting unit could be confined by said polymer. Each semiconductor light emitting unit could only propagate within a single semiconductor light emitting unit region. The polymer provides continuous structure to connect the matrix array of the semiconductor light emitting units. In another embodiment of the present invention, a color conversion layer is formed on top of each single semiconductor light emitting unit to convert the light from a first spectrum to a second spectrum.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
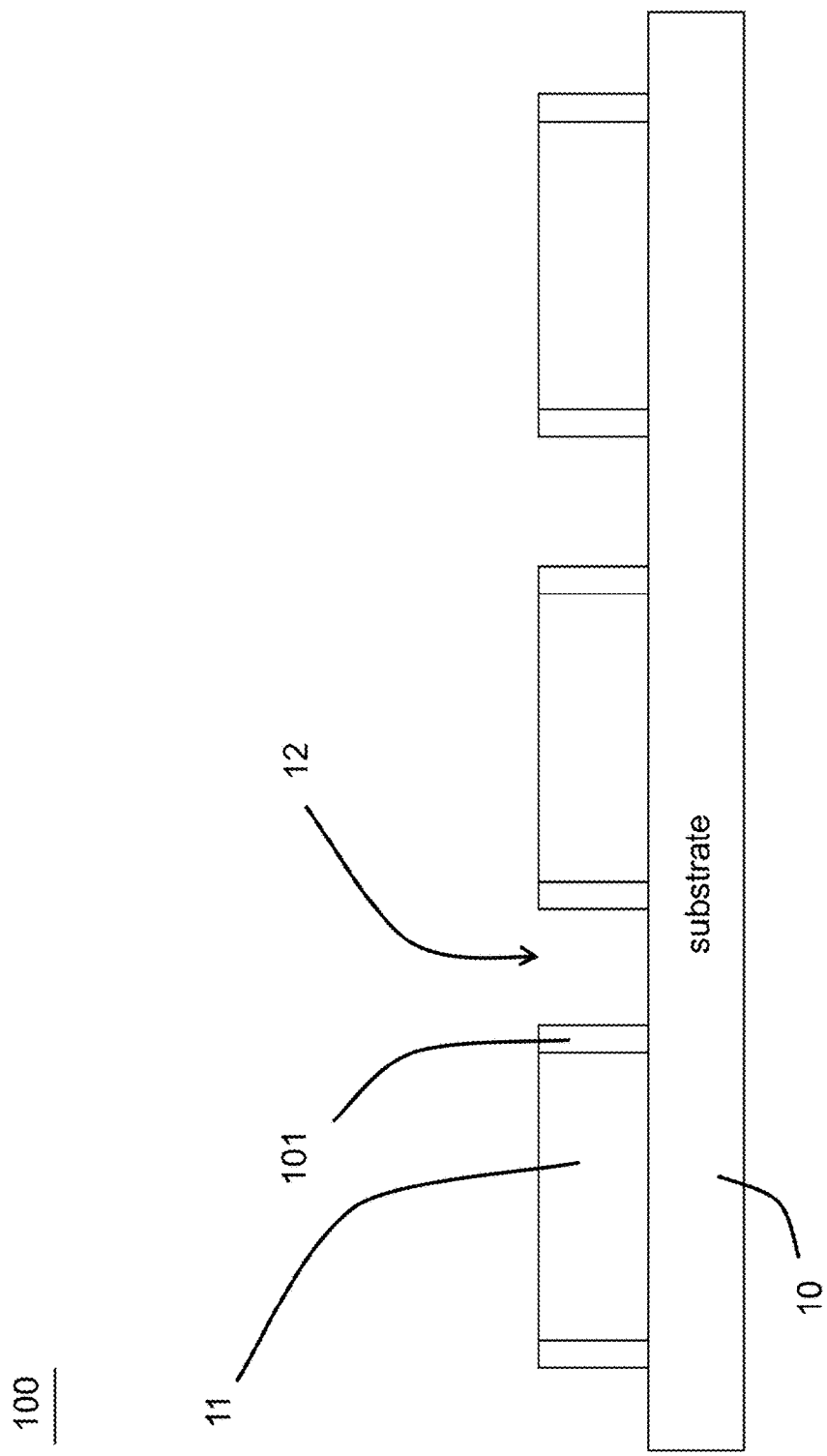
FIG. 1 is a schematic cross section diagram of a semiconductor chip array on a substrate, and an isolation layer on the edge of each semiconductor unit.

FIG. 1 shows the scheme cross section diagram of a semiconductor array 100 on a substrate 10, and an isolation layer 101 on the edge of each semiconductor unit 11. Multiple semiconductor units 11 combined the semiconductor array 100. The semiconductor unit 11 and a street 12 could be defined by photolithography and patterning. The isolation layer 101 could be deposited and patterning to form on the edge of the semiconductor unit 11. In option, the isolation layer 101 could be patterned proportion on top of the semiconductor unit 11. The isolation layer 101 could be deposited by dielectric material such as $SiO_x$, $Si_xN_y$, $Al_2O_3$, $TiO_2$ using plasma enhance chemical vapor deposition, chemical vapor deposition, physical vapor deposition, atomic layer deposition. The isolation layer 101 could be polymer such as polyimide, silicone, and epoxy.

Figure 2:
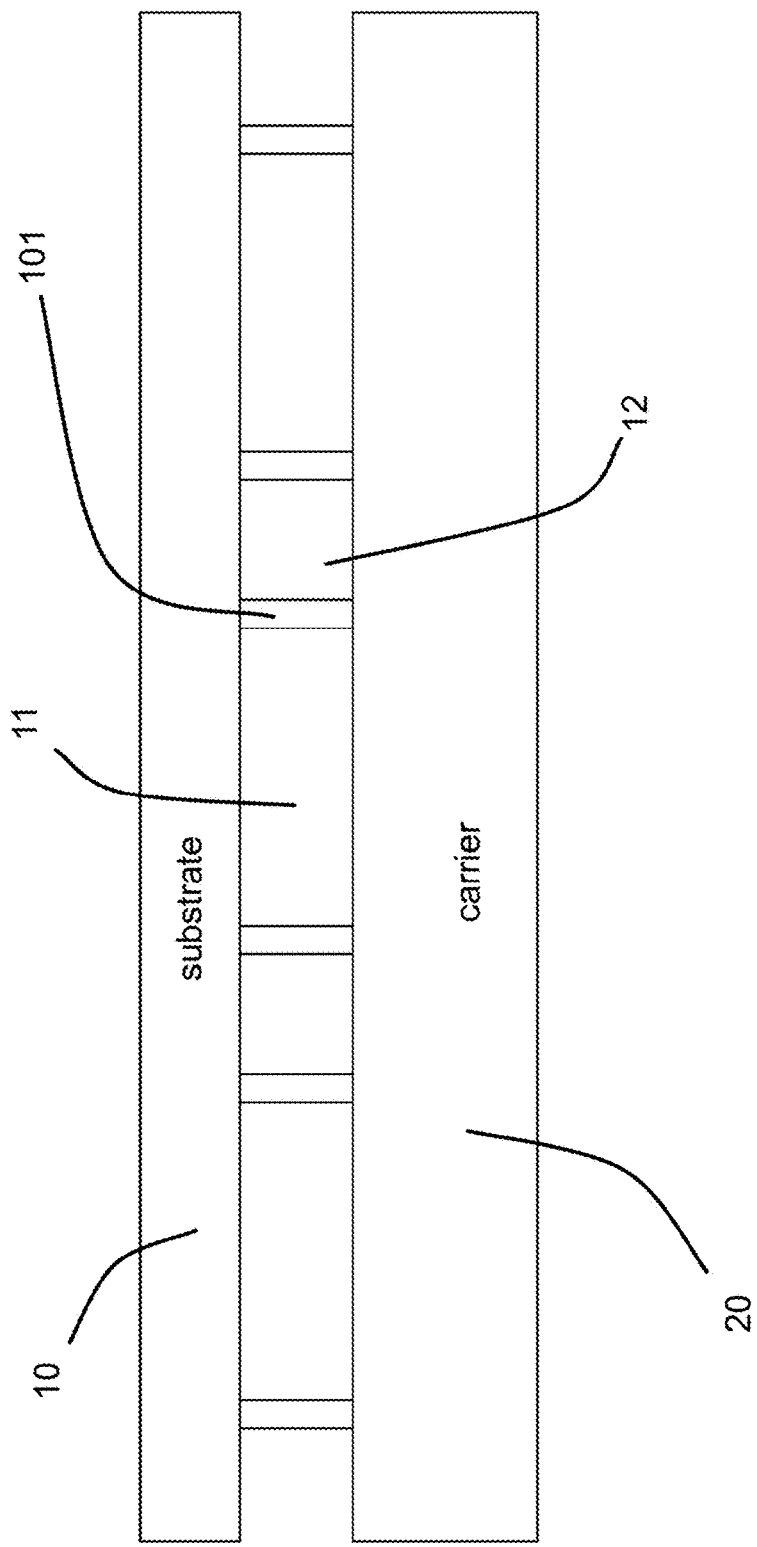
FIG. 2 is a schematic cross section diagram of a semiconductor chip array and edge surrounding isolation layer mounting to a carrier.

FIG. 2 shows the scheme cross section diagram of semiconductor array 100 and edge surrounding isolation layer 101 mounting to a carrier 20. The carrier 20 could be hard material such as Si wafer, glass, sapphire, or any semiconductor wafers. The carrier 20 could be flexible material such as polyimide, plastics, thin glass or any material having flexible and soft properties. The mounting process could be selected form solder bonding, glue attach, stamping. A street 12 could be formed between the semiconductor unit 11 and the carrier 20.

Figure 3:
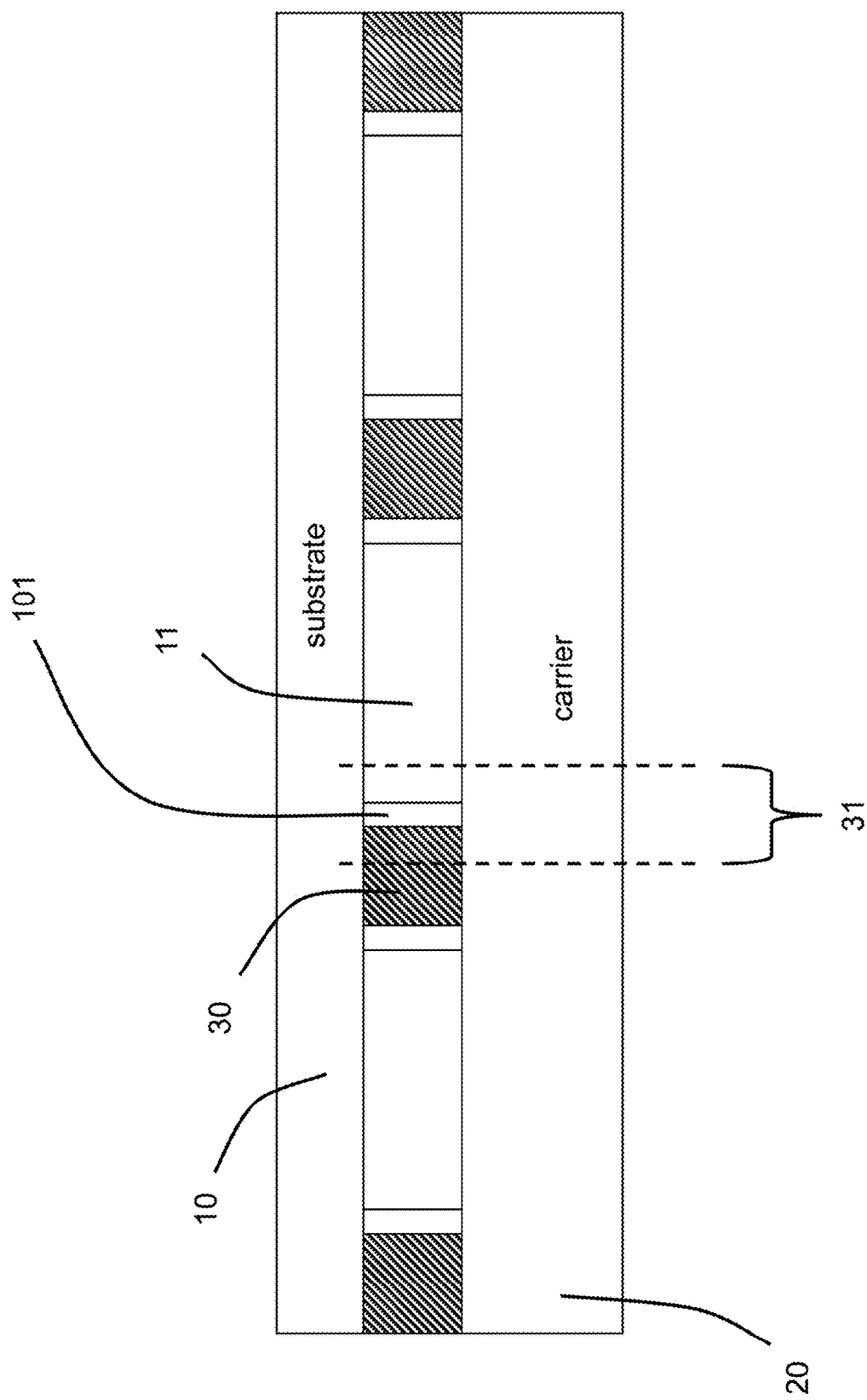
FIG. 3 is a schematic cross section diagram of filling with the polymer in a street between semiconductor chip array units and the carrier.
Figure 4:
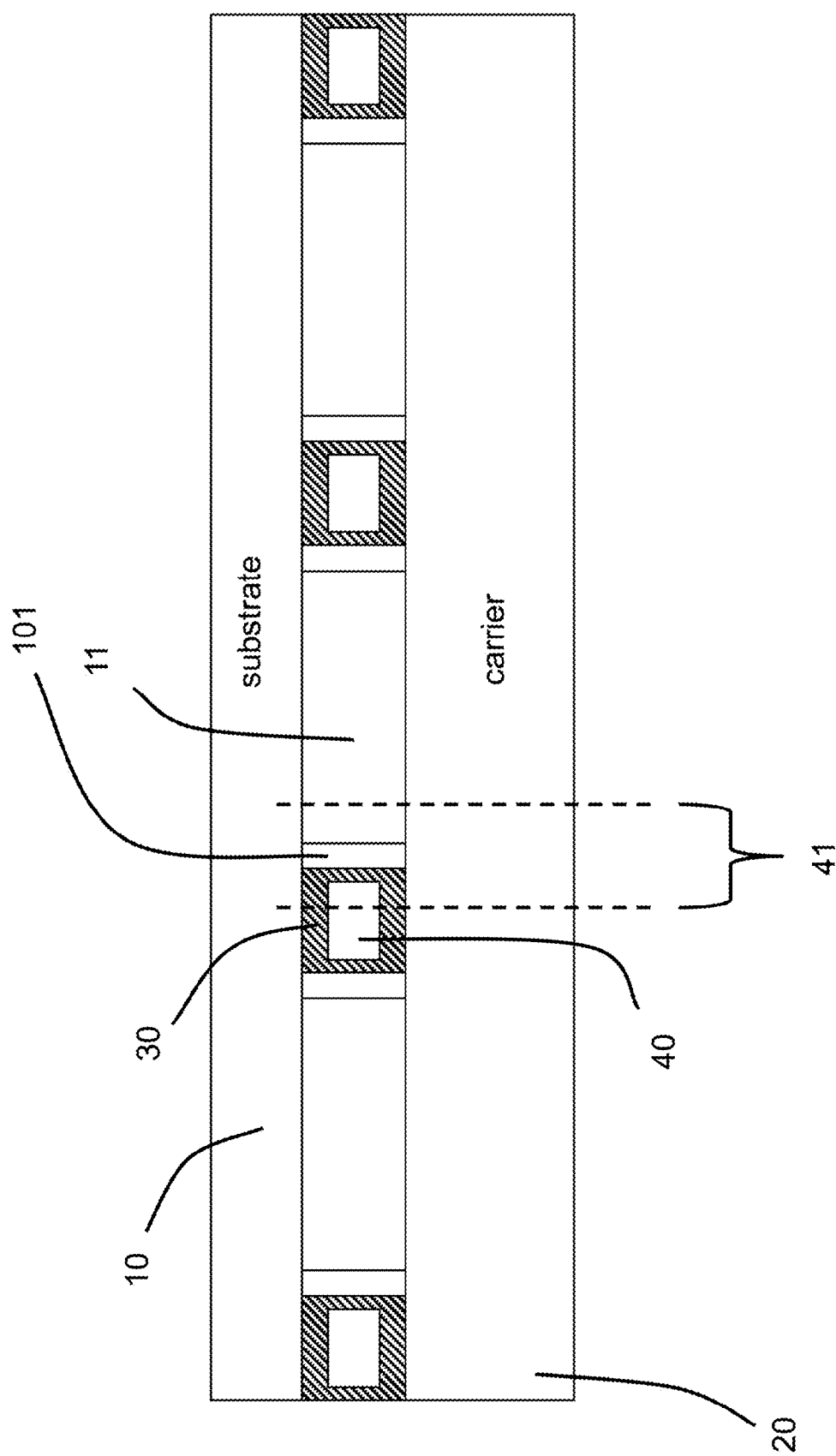
FIG. 4 is a schematic cross section diagram of covering with the polymer layer in a street between semiconductor chip array units and the carrier and forming an air gap.

In one embodiment, the invention provides a decomposed or buffer unit. The decomposed or buffer unit can be satisfied by a polymer. Please refer to FIG. 3, FIG. 3 shows the scheme cross section diagram of filling with the polymer 30 in a street 12 between semiconductor units 11 and the carrier 20. In another embodiment, FIG. 4 shows the scheme cross section diagram of covering with the polymer 30 in a street 12 between semiconductor units 11 and the carrier 20 and forming an air gap 40. The polymer 30 could be single layer or multiple layers covering into the semiconductor array units.

The polymer 30 could be cured by thermal curing, UV curing, or IR curing after photolithography patterning or filling. The polymer 30 could be selected from the hard materials, such as gels, glues, sol-gels, epoxy, silicone, polyimide, phenyl-silicone; photo-sensitive resister, UV cure able glues, and thermal cure able glues. The polymer 30 could be also selected from the stretch materials, such as gels, glues, epoxy, polyimide, parylene, silicone, methyl-silicone, cohesive gels, silicone gels, PMMA, photosensitive photoresist, UV or thermal cure able glues.

Now referring to FIG. 3, and FIG. 4, the polymer 30 formed in street could help to make the structure of the semiconductor units 11 more robust. In one embodiment, one sandwich structure 31 could be formed by the polymer 30, isolation layer 101 and the semiconductor units 11. The semiconductor unit 11 and the polymer 30 sandwich the isolation layer 101. The isolation layer 101 could be supported well by the sandwich structure. The isolation layer 101 could be protected by the edge of the semiconductor units 11 and the polymer 30 which in the street 12. In addition, the continuous interfacial structure underneath of the substrate 10 could help to enhance the entire semiconductor array 100 strength. For any additional further process steps, the continuous structure could be sustained with no damage. For example, when applying a physical force to remove the substrate 10, the polymer 30 could provide a continuous robust strength structure for the entire semiconductor units 11 on the carrier 20 to prevent the damage/crack of hard materials (or called brittle materials). The hard material (or called brittle material) could be the semiconductor chips layers, the isolation layer 101, and the cured polymer 30. In another embodiment, one sandwich structure 41 could be formed by air gap 40, the polymer 30, isolation layer 101 and the semiconductor units 11.

Figure 5:
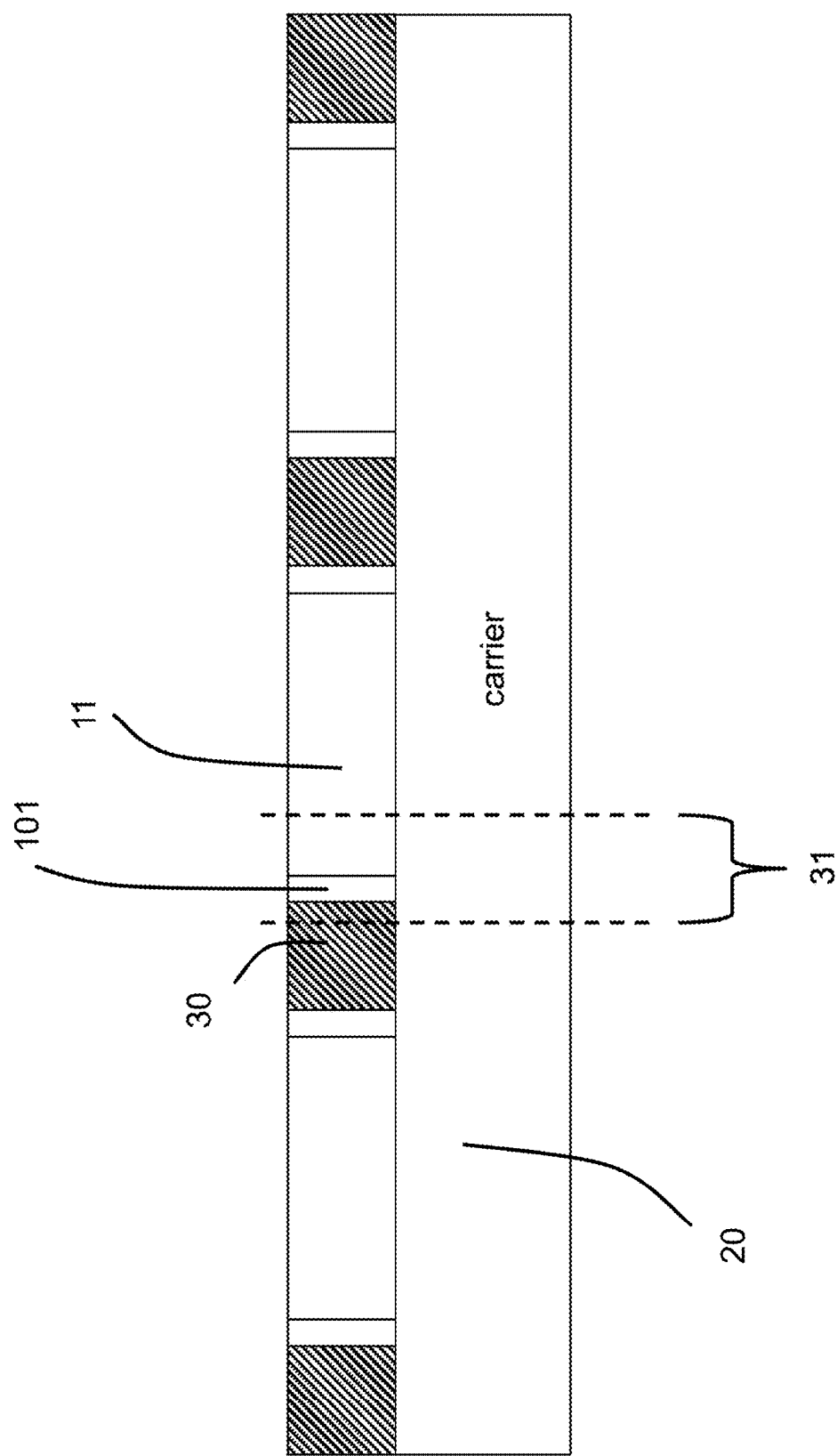
FIG. 5 is a schematic cross section diagram of FIG. 3 structure after removing the substrate.
Figure 6:
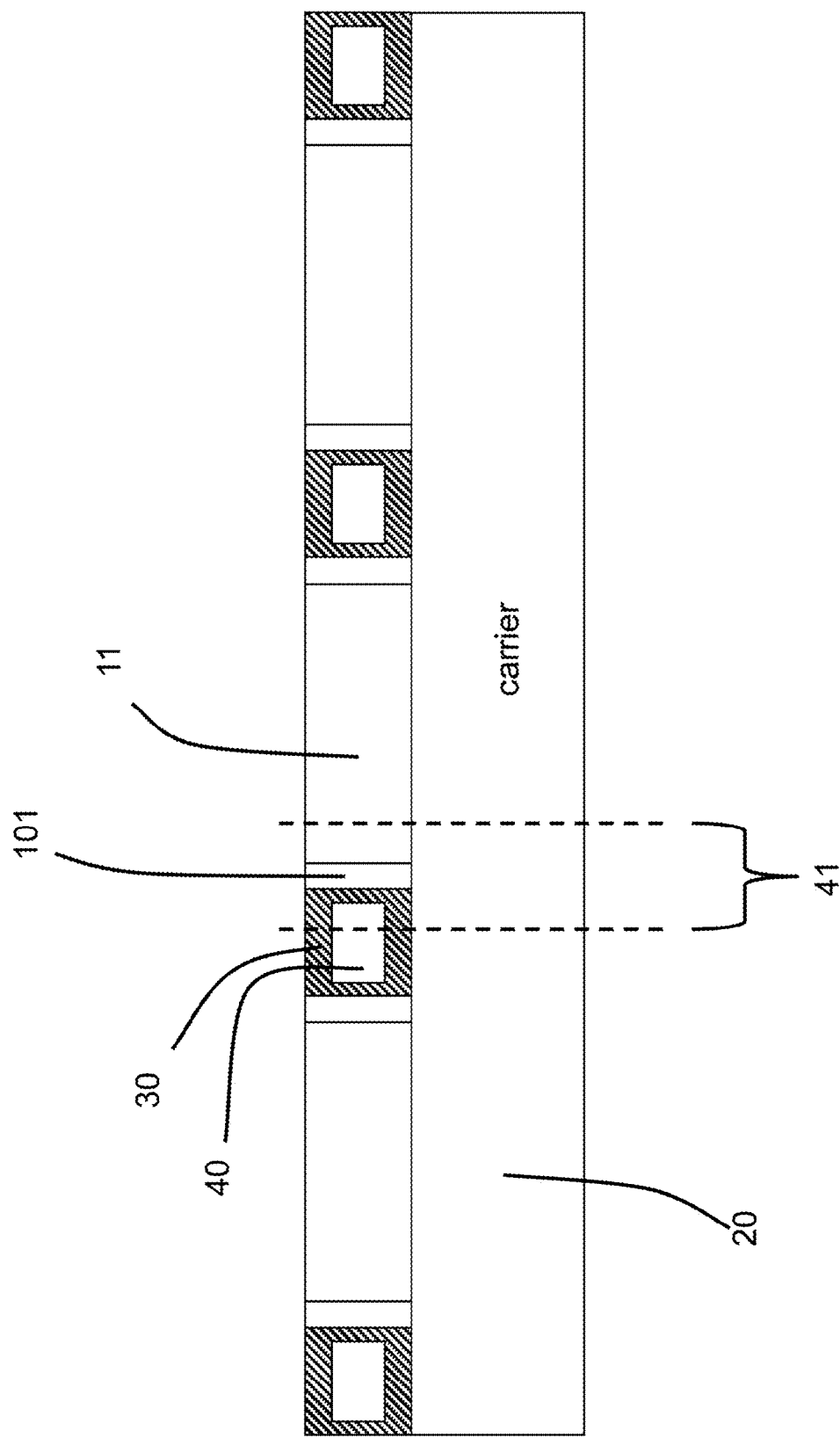
FIG. 6 is a schematic cross section diagram of FIG. 4 structure after removing the substrate.

FIG. 5 shows the scheme cross section diagram of FIG. 3 structure after removing the substrate 10. FIG. 6 shows the scheme cross section diagram of FIG. 4 structure after removing the substrate 10.

The substrate 10 could be removed through different technologies. The removing of the substrate 10 could be performed through laser irradiation technology, substrate 10 grinding technology, chemical wet etching technology, planer, and mechanical substrate 10 removal technology. When substrate 10 is performed through laser irradiation technology, the semiconductor units 11 and polymer 30 are decomposed materials.

For the grinding, planer, and mechanical technologies, a violent physical force to remove the substrate 10 is required. The continuous materials structure underneath of the interface of substrate 10 could connect and hold all of the materials together as a completely connecting structure. The isolation layer 101, polymer 30, and the semiconductor unit 11 could be completely protected by the completely compact connecting structure. The completely compact connecting structure underneath of the substrate 10 could provide enough strength to keep the whole structure more robust on the carrier 20 without damage during the violent grinding process.

For the chemical wet etching technology, the substrate 10 may be removed or etched by violent chemical solution. The continuous materials structure underneath of the interface of substrate 10 could connect and hold all of the materials together as a completely connecting structure. The sandwich structure of the connecting materials could provide a compact continuous layer to stop the chemical solution penetration. When applying the chemical solution to remove the substrate 10, the continuous compact interfacial structure underneath of the substrate 10 could protect the entire structures on the carrier 20 without chemical damaging.

For the laser irradiation lift off, the laser could irradiate through the substrate 10 and interacting on the interface of the material underneath the substrate 10. The interfacial layers underneath of the substrate 10 could be decomposed or not decomposed. The continuous materials structure underneath of the interface of substrate 10 could connect and hold all the materials together as a completely compact connecting structure. In other words, the polymer 30 is to fix a shape of the semiconductor units 11 and buffer a stress of the semiconductor units 11. The isolation layer 101, polymer 30, and the semiconductor unit 11 could be completely protected by the completely compact connecting structure. The substrate 10 could be delaminated by additional physical force from the completely compact connecting structure. The connecting structure of isolation layer 101, polymer 30, and the semiconductor unit 11 could be no change before and after applying laser and another physical force to remove the substrate.

It should be noted that, the semiconductor units 11 and the polymer 30 are decomposed materials when the removing of the substrate 10 is performed through laser irradiation technology; the semiconductor units 11 is decomposed materials when the removing of the substrate 10 is performed through chemical wet etching technology.

For the particular case separation of substrate 10 by the laser irradiation, this method could be applied to any suitable process in different application filed such as semiconductor light emitting array unit display, touch panel, light emitting diode solid state lighting, micro engineering mechanical system, high power devices, solar cell, lithium battery, and other suitable semiconductor process. In another embodiment, such as flexible semiconductor light emitting array unit display, flexible solar cell, flexible battery (flexible lithium battery), flexible light emitting diode solid state lighting, flexible sensors, flexible panels, flexible electronics, the forming of the polymer 30 in sandwich structures (31 or 41) and applying laser irradiation to transfer thin film devices to a flexible carrier could be very useful methods to protect devices completely and save cost.

Now referring to FIG. 3, and FIG. 4, the substrate 10 could be replaced to any transparent material called "transparent substrate" for laser passing through. The semiconductor unit 11 could be replaced to any material having laser decomposition properties material called "first laser decompose able unit". The isolation layer 101 could be replaced to any laser non-decomposition properties material called "laser non-decompose able unit", and the polymer 30 could be replaced to any laser decomposition material called "second laser decompose able unit". The laser passing through the "transparent substrate" and decomposing the interfacial layer underneath of the "transparent substrate". The decomposing interfacial layer is a portion the "first and second laser decompose able unit". After laser irradiation to these units underneath of the "transparent substrate 10", the continuous materials structure underneath of the "transparent substrate 10" could connect and hold all the materials together as a completely connecting structure. The "first laser decompose able unit", and "second laser decompose able unit" sandwich the "laser non-decompose able unit". The completely compact connecting structure could be robust to sustain any other physical force. The "transparent substrate 10" could be delaminated by additional physical force from the completely compact connecting structure. Please note that the "laser non-decompose able unit" deposited on the "transparent substrate 10" could be peeled from the "transparent substrate 10" without damage due to well sandwich structure of the "first laser decompose able unit" and "second laser decompose able unit".

In some particular application such as the curved able or flexible electronic device application, the polymer 30 in the street 12 could be provided as stretch properties to allow the bending force acting on the flexible devices without damaging. The stretch material could help to support the semiconductor units and provide flex properties to prevent the crack or damage of hard materials in the structure. For application of curved or flexible electronic devices, the stretch property of polymer 30 could provide a well supporting to maintain the integrity for the structure of FIG. 5 and FIG. 6. During the bending action, the stretch polymer 30 could be extended well without separation.

Figure 7:
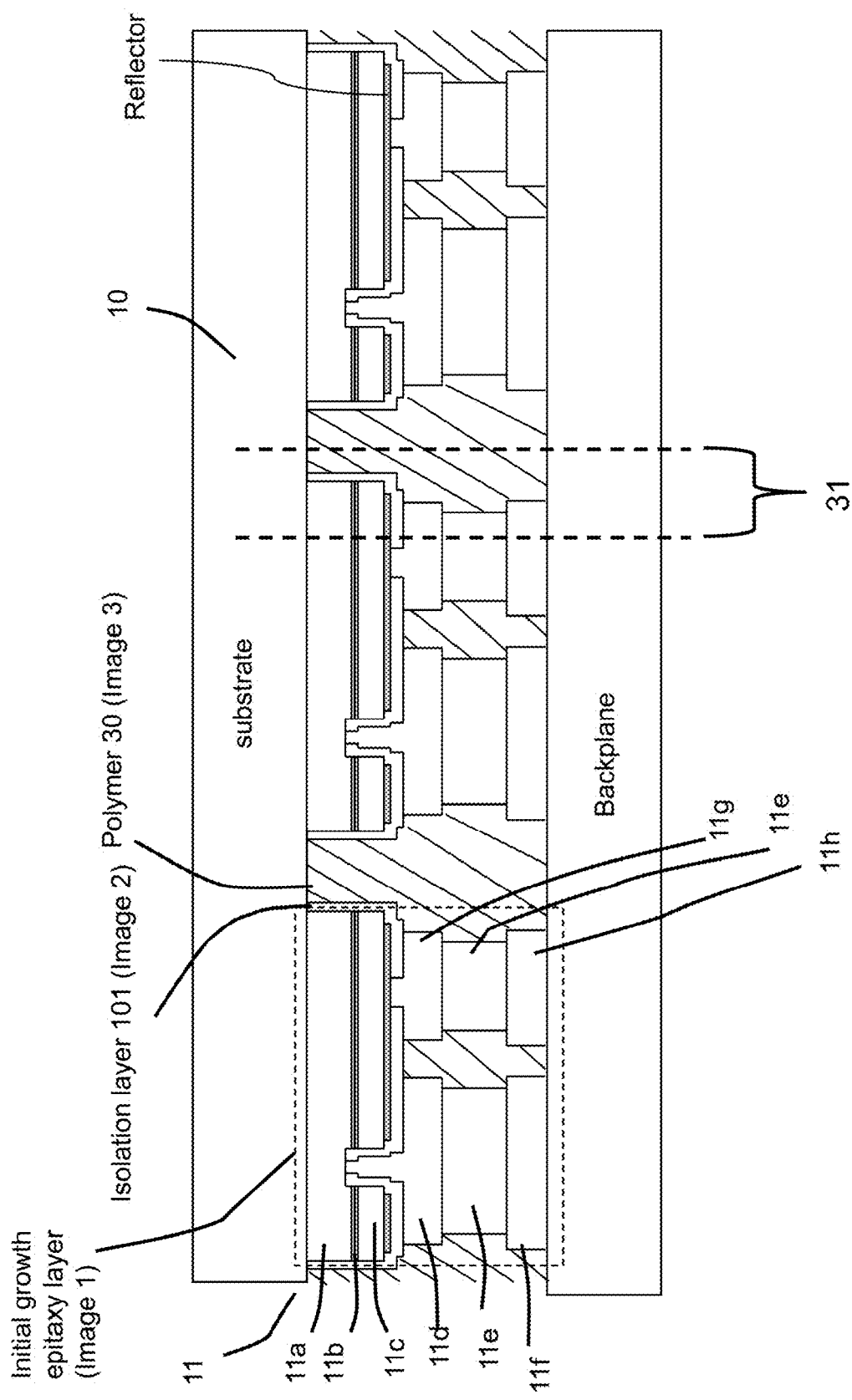
FIG. 7 is a schematic cross section diagram of multiple semiconductor light emitting array units filling with the polymer mounting on the backplane (driver).

FIG. 7 shows the scheme cross section diagram of multiple semiconductor units 11 filling with the polymer 30 mounting on the driver. In the embodiment, each semiconductor units 11 is satisfied by a semiconductor light emitting unit. The semiconductor units 11 includes n-type layer 11a, active layer 11b, p-type layer 11c, n-electrode 11d, eutectic (solder) 11e, cathode 11f, p-electrode 11g and anode 11h. Single semiconductor light emitting unit is the direct bandgap compound semiconductor light emitting diode (LED). The LED epitaxy structure grown on the substrate 10 consists of the initial growth epitaxy layer (n-type layer 11a), the active layer 11b, and the p-type layer 11c. The semiconductor light emitting unit structure consists of the reflector layers, the isolation layer 101, the n-electrode layers, the p-electrode layers, and the eutectic (solder) layers. The electrodes of semiconductor light emitting unit is mounted to the cathode 11f (for n-electrode 11d), anode 11h (for p-electrode 11g) of the backplane (driver) by using eutectic (solder) 11e. Between two neighbor semiconductor light emitting units, a street region is formed (isolated) as a street to separate each single semiconductor light emitting unit. Between the semiconductor light emitting unit and the backplane (driver), a region is formed as another street to isolate the p-electrode 11g and n-electrode 11f. The single semiconductor light emitting unit could be provided as a light engine array unit of a sub-pixel. The direct bandgap semiconductor light emitting unit has self-emissive characteristics by current driving. Each sub-pixel light engine unit could be controlled individually by the backplane (driver) to display images.

In the street region, as shown in FIG. 7, the polymer 30 is complete filling up to the edges of the single semiconductor light emitting unit and the backplane (driver). The polymer 30 fills up and covers on the bottom surface of the substrate 10 and covers on the top surface of the backplane (driver). The isolation layer 101 (insulation layer) is forming on the edge of the each semiconductor light emitting unit. The polymer 30 fills up and covers the isolation layer 101. The polymer 30 fills up and covers the sidewalls of electrodes (n-electrode 11d and p-electrode 11g) of each semiconductor light emitting unit. The polymer 30 fills up and covers the sidewall of the eutectic (solder) 11e layer, and the sidewall of the electrodes (cathode 11f and anode 11h) of backplane (driver).

The polymer 30 fill in the street region could be as a function of black matrix of array. The light emitted from each sub-pixel light engine array unit could be confined to propagate the light only in each single sub-pixel region. The light generated from each sub-pixel light engine array unit could be irradiated to any angle and emitted to the neighbor sub-pixels region. By filling polymer 30 in the street, the emitting light of each sub-pixel light engine array unit could be absorbed (or said stopped) by street polymers. Thus, the polymer 30 formed in the street could be a function of black matrix array to prevent the light crosstalk effect. The polymer 30 underneath of the substrate 10 in the street region could connect all individual sub-pixel light engine array units together. The continuous materials underneath of the substrate 10 including the initial growth epitaxy layer, the isolation layer 101, the polymer 30, could be connected together to form a robust continuous structure.

In the region between cathode 11f and anode 11h within a single semiconductor light emitting unit, the region could be completely filled up polymer.

The semiconductor light emitting unit could be selected from different types of chip structure such as flip chip type, or vertical type, or resonant cavity type light emitting diode (RCLED), or vertical cavity surface emitted laser (VCSEL), or laser diode. The semiconductor light emitting unit composites the epitaxy structure could be formed by direct bandgap compound semiconductor light emitting diode. The emitting wavelength of semiconductor light emitting unit could be determined by the energy bandgap of direct bandgap semiconductor. Different direct energy bandgap of the semiconductor light emitting material could be selected from III-V compound semiconductor such as $In_xGa_{1-x}N$, GaN, $Al_xGa_{1-x}N$, $In_xGa_{1-x}As$, InGaP, GaAs, GaAsP, InP, $(Al_xGa_{1-x})_yIn_{1-y}P$, GaP.

The reflector underneath the p-type layer 11c could be formed by high reflectivity metal layers such as Ni/Ag, Ni/Al, Ag alloyed, and Al alloyed metallization. In some particular purpose, the reflector layer could be formed by a semi-transparent contact such as Indium Tin Oxide (ITO) to make the contact to p-type layer 11c and spread the current. After the semi-transparent contact forming, a distributed Bragg reflector (DBR) layers could be deposited to reflect the high compact and directional light beam. For the high gamut of display requirement, the emitting light spectrum width of sub-pixel light engine could be narrowed by the DBR structure. The p-electrode 11g and n-electrode 11d could be deposited underneath of the semiconductor light emitting unit by selecting metal layers. The electrode metal layers could be formed by selecting the metals from Ni, Cu, Al, Au, Ti, and its alloy. The thickness of the electrodes metal layers could be greater than that of the thickness of one third epitaxy growth thickness. A eutectic metal layer or solder metal layers could be deposited underneath of the electrodes of the semiconductor light emitting units. The eutectic (solder) 11e layers as a connecting layers could be selected from AuSn, CuSn, Sn, CuAgSn, Indium, SnBi, or any suitable eutectic (soldering) metallization. In some particular case, the eutectic (soldering) metallization could be replaced to be an anisotropic conductive adhesive material could be forcefully connect the LED to the backplane (driver), the P-type and N-type can become fully insulated. For the anisotropic conductive adhesive material, it has metallic powder covering with nonconductive shield mixing in a polymer. The nonconductive shield could be broken by thermal bonding technology to provide anisotropic conductive function. For alignment purpose in this invention, the mixing polymer should have semi-transparent properties. The backplane (driver) could be hard material such as glass, sapphire, Si wafer, or any suitable semiconductor wafer. The backplane (driver) could be flexible or stretchable material such as polyimide, plastic, thin glass. The data-lines and scan-lines of the backplane (driver) could be formed by passive matrix (PM) driving mode or active matrix (AM) driving mode to control the images display as commonly used display backplane (driver). The cathodes and anodes could be separated and patterned to form on top of the array circuit lines such as scan-lines and data-lines. Each sub-pixel light engine array unit could be switched on and off by scanning to control the data-lines, and scan-lines circuit. The data-lines and scan-lines could be active mode driving mode and fabricated by Metal-Oxide-Semiconductor Field-Effect Transistor (MOSFET), Complementary Metal-Oxide-Semiconductor (CMOS), Thin-Film Transistor (TFT), Low Temperature Poly-silicon (LTPS), Indium Gallium Zinc Oxide (IGZO) methods to achieve.

By using IC technologies, a matrix of CMOS array module could be formed on the backplane (driver). Each CMOS array unit could be integrated circuit design to connect with data line and scan line. Each sub-pixel light engine array unit turn-on or turn-off could be switched by each CMOS array unit. By using a commonly used two transistors and one capacity controlling circuit to each CMOS array unit, each sub-pixel contrast ratio, each sub-pixel brightness, each sub-pixel switch speed, each sub-pixel gray level could be programmed, adjusted, tuning Each CMOS array unit could be controlled by image display control IC.

In another aspect, the backplane (driver) could be formed on any suitable transparent hard carriers, such as sapphire, glass, quartz, acrylic, epoxy, PMMA etc., to provide a transparent carrier for some particular application such as double side transparent display. In some particular case, for the application of double side image display, the circuit of the data-lines, scan-lines, electrodes could be formed by transparent contact metallization or semitransparent contact metallization such as ITO, IGZO, nano silver lines, or Graphene. The material of the backplane (driver) could be selected from curve able, flexible, soft materials, such as polyimide, plastic, soft and thin glass, epoxy, PMMA, silicone, to provide a carrier for the curved and flexible display application.

For the flexible backplane (driver), in one embodiment, the commonly active matrix (AM) driving methods such as MOSFET, CMOS, TFT (Thin-Film Transistor), LTPS (low temperature poly-silicon), and IGZO (indium gallium zinc oxide) could be formed on the flexible material. In another embodiment, passive matrix driving methods such as stacking circuit with cathodes, and anodes could be formed by using 3 D stacking circuit, flexible printed circuit film, Flexible Panel Circuit (FPC), Chip On Film (COF) fabrication technology on the flexible material.

The polymer 30 could be formed by patterning and filling. The polymer 30 could be cured by thermal curing, UV curing, or IR curing after photolithography patterning or filling. The polymer 30 could be selected from the hard materials, such as gels, glues, sol-gels, epoxy, silicone, polyimide, phenyl-silicone; photo-sensitive resister, UV cure able glues, and thermal cure able glues. The polymer 30 could be also selected from the stretch materials, such as gels, glues, epoxy, polyimide, parylene, silicone, methyl-silicone, cohesive gels, silicone gels, PMMA, photosensitive photoresist, UV or thermal cure able glues.

In another aspect, the polymer 30 could be purposed as black matrix array to absorb the light. The polymer 30 could be selected from dyeing hard materials, such as gels, glues, sol-gels, epoxy, silicone, polyimide, phenyl-silicone; photo-sensitive resister, UV cure able glues, and thermal cure able glues. The polymer 30 could be also selected from dyeing stretch materials, such as gels, glues, epoxy, polyimide, parylene, silicone, methyl-silicone, cohesive gels, silicone gels, PMMA, photosensitive photoresister, UV or thermal cure able glues. The polymer 30 could be also purposed as black matrix to confine the light within a sub-pixel region. The polymer 30 could be selected from mixing the polymer with sub-micro size powders. The powders could be selected from $TiO_2$, $Al_2O_3$, $SiO_2$, ZnO, Si. When the light hit the black matrix, the light could be refracted and reflected back to single sub-pixel region by the sub-micro size powders mixing polymer.

Figure 8:
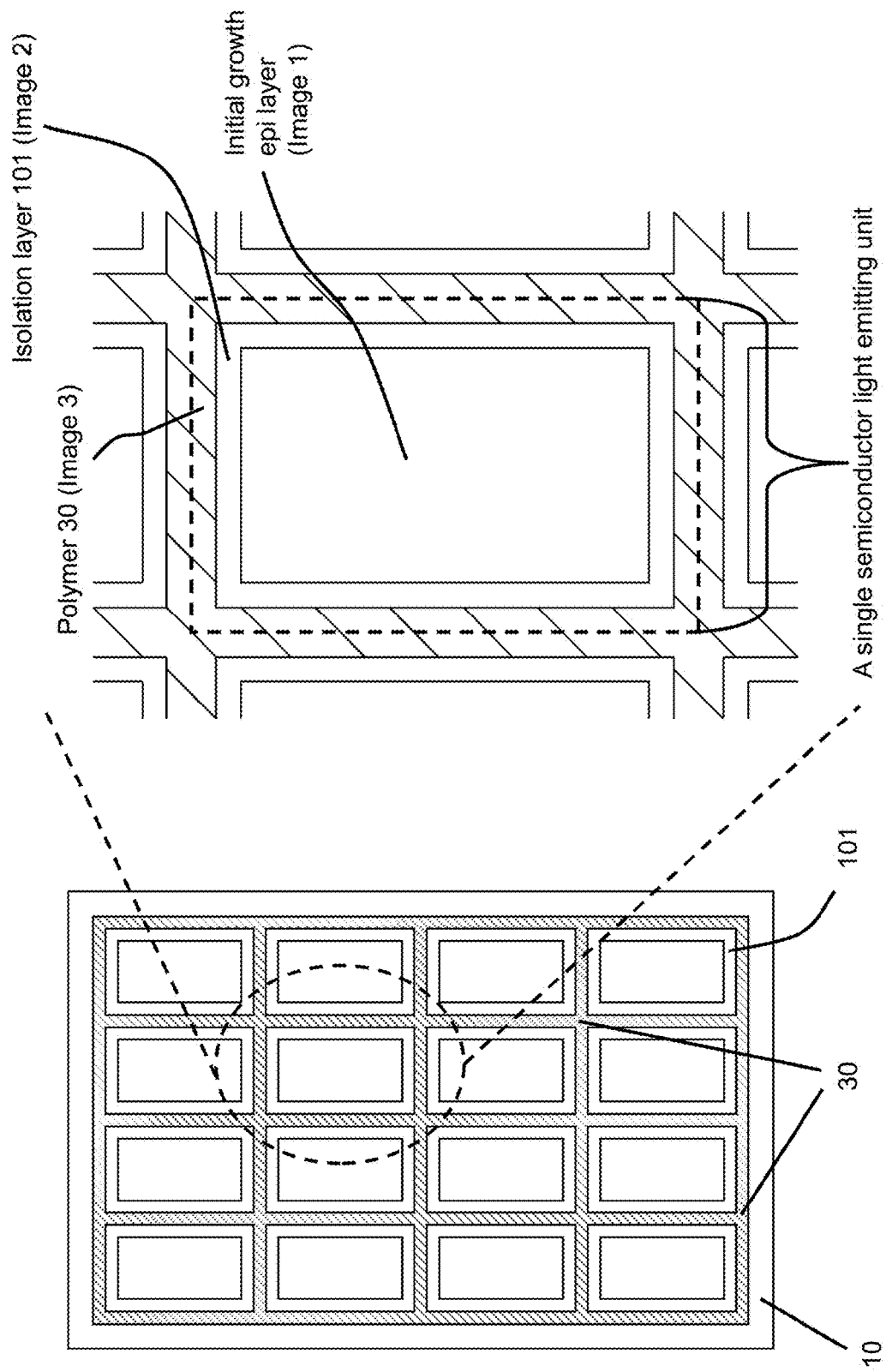
FIG. 8 is the top view of the FIG. 7, showing an example of 4×4 semiconductor light emitting array units filling with the polymer mounting on the backplane (driver).

Now referring to FIG. 8, the top view of FIG. 7 structure is shown in FIG. 8. FIG. 8 shows an example of the 4×4 matrix semiconductor light emitting unit array. The region between two semiconductor light emitting array units is called the street region. Each semiconductor light emitting array unit could be separated by a street and the street could be occupied completely by polymer 30. From the top view of FIG. 7, FIG. 8 illustrates each semiconductor light emitting unit has one interfacial epitaxy image (Called image 1) which is the initial interfacial growth epitaxy layer underneath of the substrate 10. In the 4×4 matrix array, an isolation layer 101 could be deposited surround on each semiconductor light emitting unit has the second interfacial image (Called image 2) which is the isolation layer 101 underneath of the substrate 10. The isolation layer 101 is surrounding covered on the edge of each semiconductor light emitting unit. In the street region, the polymer 30 underneath of the substrate 10 shows another different interfacial image (Called image 3). The polymer 30 formed in the street region could help to make the structure of the semiconductor light emitting units more robust. One sandwich structure could be formed by the polymer 30 and the semiconductor light emitting units. The semiconductor light emitting unit and the polymer 30 sandwich the isolation layer 101. The isolation layer 101 could be supported well by the sandwich structure. The isolation layer 101 could be protected by the edge of the semiconductor light emitting units and the street polymer 30. In addition, the continuous interfacial structure underneath of the substrate 10 could help to enhance the entire matrix array structure strength. For any additional further process steps, the continuous structure could be sustained with no damage. For example, when applying a physical force to remove the substrate 10, the polymer 30 could provide a continuous robust strength structure for the entire array sub-pixel light engines to prevent the damage/crack of hard materials (or called brittle materials). In other words, the polymer 30 is to fix a shape of the semiconductor units 11 and buffer a stress of the semiconductor units 11. The hard material (or called brittle material) could be the epi structure layer, the isolation layer 101, and the cured polymer 30.

Figure 9:
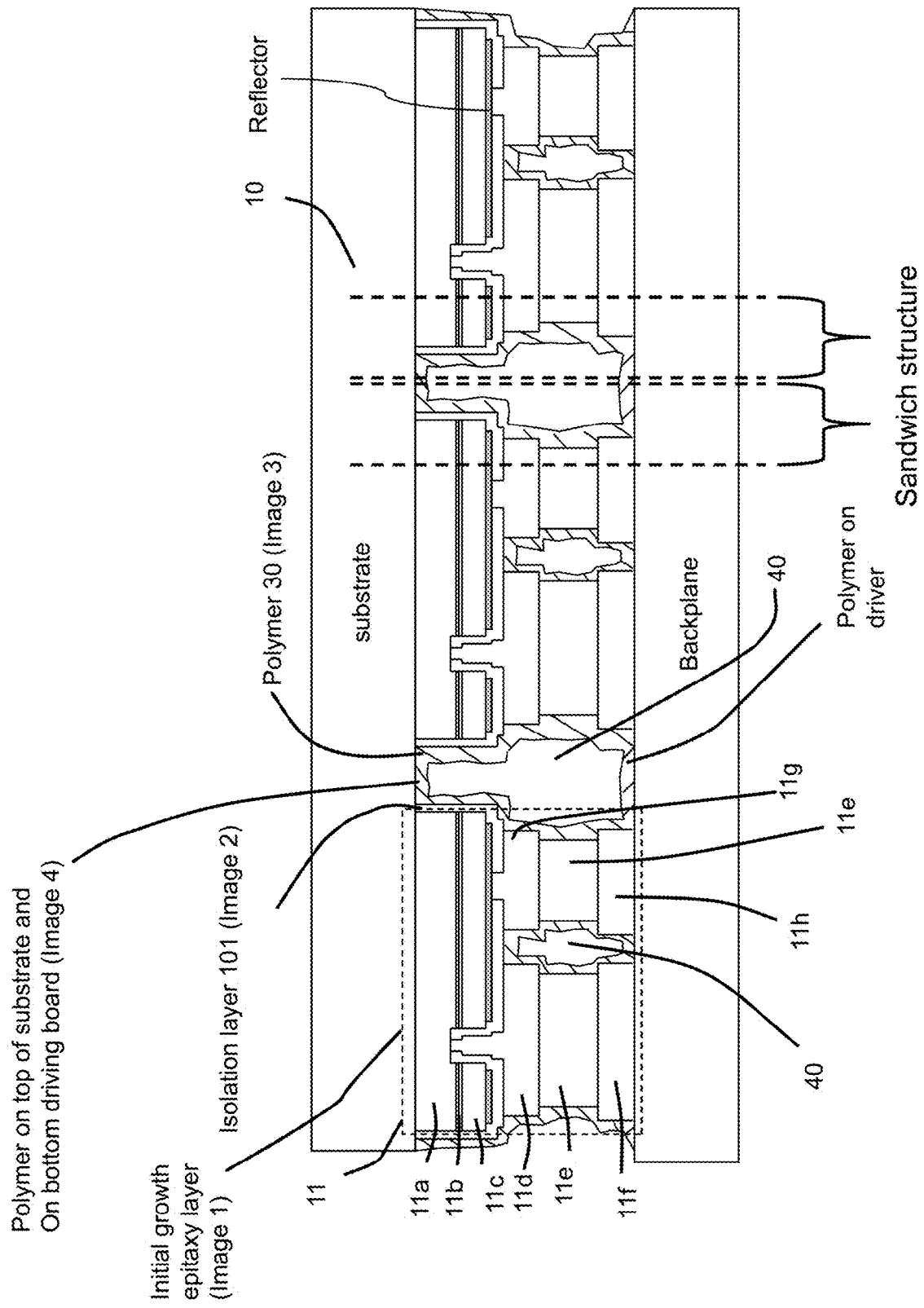
FIG. 9 is a schematic cross section diagram of multiple semiconductor light emitting array units covering with the polymer layer mounting on the backplane (driver).

In another embodiment for semiconductor light emitting unit display application, FIG. 9 shows the scheme cross section diagram of multiple semiconductor light emitting units covering with the polymer 30 layer mounting on the backplane (driver). Similar as the structure of FIG. 7, each single semiconductor light emitting unit is the compound semiconductor light emitting diode (LED). The LED epitaxy structure grown on the substrate 10 consists of the initial growth epitaxy layer (n-type layer 11a), the active layer 11b, and the p-type layer 11c. The semiconductor light emitting unit structure consists of the reflector layer, the isolation layer 101, the n-electrode layer 11d, the p-electrode layer 11g, the eutectic (solder) 11e layer. The electrodes of semiconductor light emitting units is mounted to the cathode 11f (for n-electrode 11d), anode 11h (for p-electrode 11g) of the backplane (driver) by using eutectic (solder) layer. Between two neighbor semiconductor light emitting units, a street region is formed (isolated) as a street to separate each single semiconductor light emitting unit. Between the semiconductor light emitting unit and the backplane (driver), a region is formed as another street to isolate the p-electrode 11g and n-electrode 11d. The single semiconductor light emitting unit could be provided as a single sub-pixel light engine unit. The direct bandgap semiconductor light emitting unit has self-emissive characteristics. Each sub-pixel light engine array unit could be controlled individually by the backplane (driver) to display images.

In the street region, for the edge of each single semiconductor light emitting unit, FIG. 9 shows the polymer 30 layer could cover the bottom surface of the substrate 10, the single semiconductor light emitting unit sidewall edge and the top surface of the backplane (driver). The polymer 30 is a covering layer covers on the isolation layer 101 surround on the sidewall edge of the single semiconductor light emitting unit. The polymer 30 is a covering layer covers on the sidewalls of electrodes (cathode 11f and anode 11h) of the single semiconductor light emitting unit, the sidewall of the eutectic (solder) 11e layer, and the sidewall of electrodes (cathode 11f and anode 11h) of backplane (driver). In the street region, the polymer 30 is only a covering layer and an Air gap 40 could be formed.

In another aspect, the covering polymer 30 in the street region could be as a function of black matrix of array. The light emitted from each sub-pixel light engine array could be controlled to propagate in each single sub-pixel region. The light generated from each sub-pixel light engine array could be irradiated to any angle and emitted to the neighbor sub-pixels region. By covering the polymer 30 in the street, the emitting light of each sub-pixel light engine array could be absorbed, stopped, or reflected by street polymers. Thus, the polymer 30 formed in the street could be a black matrix array function to prevent the light crosstalk effect.

The polymer 30 underneath of the substrate 10 in the street region could connect all individual sub-pixel light engine array units together. The continuous materials underneath of the substrate 10 including the initial growth epitaxy layer, the isolation layer 101, the polymer 30, could be connected together to form a robust structure.

In the region between cathode and anode within a single semiconductor light emitting unit, the polymer 30 could be only formed as a layer underneath of the isolation layer 101 and on top of the backplane (driver). The polymer 30 is a covering layer covers on the sidewalls of electrodes (cathode, and anode) of the single semiconductor light emitting unit, the sidewall of the eutectic (solder) layer, and the sidewall of electrodes (cathode 11f and anode 11h) of backplane (driver). Please note that the Air gap 40 could be formed in the region between cathode 11f and anode 11h within a single semiconductor light emitting unit.

Figure 10:
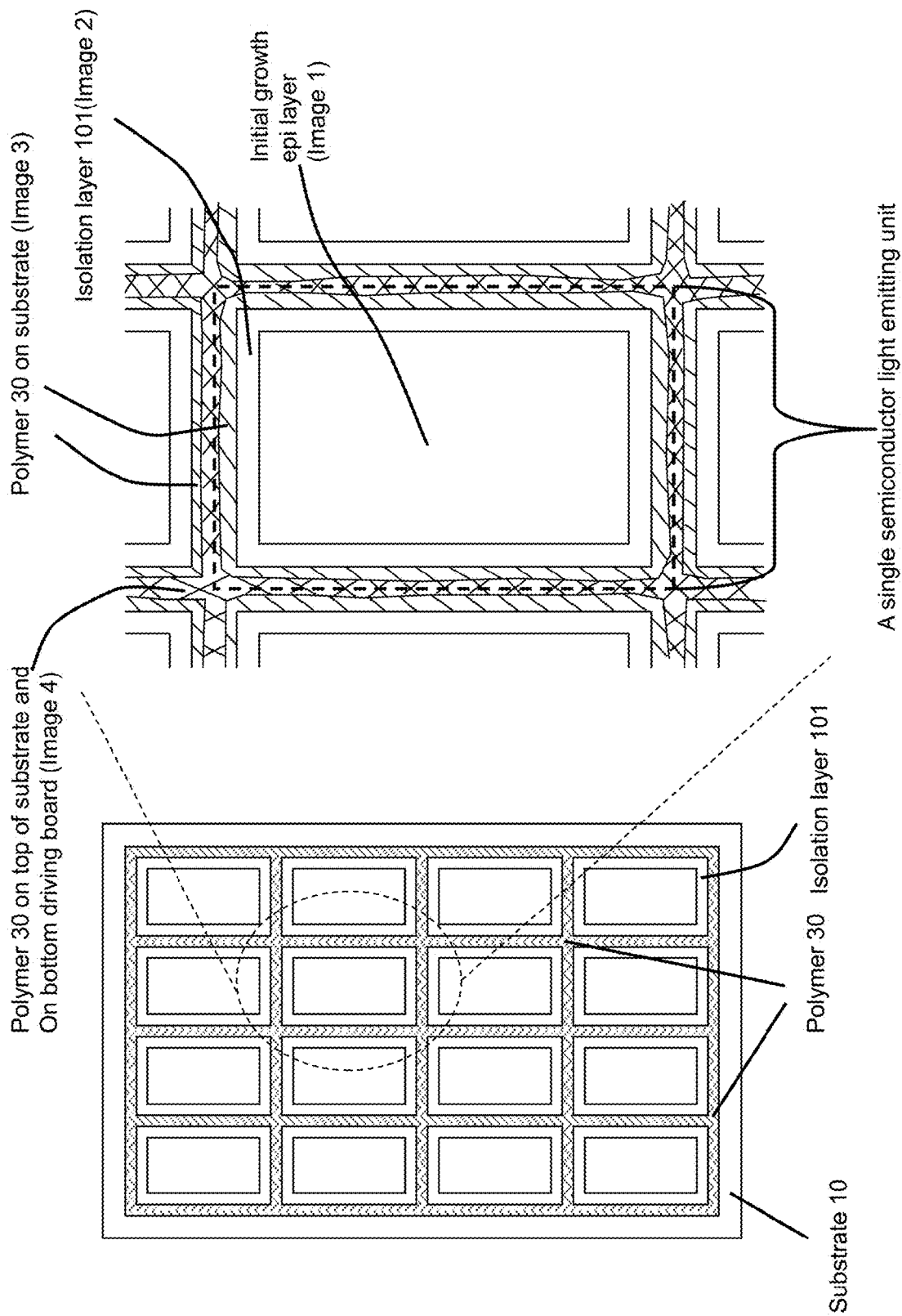
FIG. 10 is the top view of the FIG. 9, showing an example of 4×4 semiconductor light emitting array units covering with the polymer mounting on the backplane (driver).

Now referring to FIG. 10, the top view of the FIG. 9 structure is shown in FIG. 10. FIG. 10 shows an example of the 4×4 matrix semiconductor light emitting unit array covering with the polymer 30 layer in the street. From the top view of FIG. 9, FIG. 10 illustrates each semiconductor light emitting unit has one interfacial epitaxy image (Called image 1) which is the initial interfacial growth epitaxy layer underneath of the substrate 10. In the 4×4 matrix array, an isolation layer 101 could be deposited surround on each semiconductor light emitting unit has the second interfacial image (Called image 2) which is the isolation layer 101 underneath of the substrate 10. The isolation layer 101 is surrounding covered on the edge of each semiconductor light emitting unit. The region between two semiconductor light emitting units is called the street region. In the edge region of the street, underneath of the substrate 10, the polymer 30 covering on the isolation layer 101 has another interfacial image (Called image 3). In addition, in the middle of the street region, the image of the polymer 30 covering on top surface of the backplane (driver) could be reflected through the air gap 40 and mixing with the polymer 30 covers on the bottom surface of substrate 10 in the middle of the street to show another image (Called image 4).

Now referring to FIG. 9, the covering polymer 30 layer formed in the street region could connect all the semiconductor light emitting units together. The covering polymer 30 layer could help to make the structure of the semiconductor light emitting units more robust. In the street region and in the region between cathode and anode within a single semiconductor light emitting unit, the Air gap 40 was formed after the polymer 30 covering. The Air gap 40 in the specific region could be a function of air buffer to allow the structure of the semiconductor light emitting units more flexible after substrate 10 removal.

The polymer 30 formed in the street region could help to make the structure of the semiconductor light emitting units more robust. One sandwich structure could be formed by the covering street polymer 30 and the semiconductor light emitting units. The isolation layer 101 could be sandwiched by the covering street polymer layer and the semiconductor light emitting unit. The isolation layer 101 could be supported well by the sandwich structure. The isolation layer 101 could be protected by the edge of the semiconductor light emitting units and the covering street polymer layer. In addition, the continuous interfacial structure underneath of the substrate 10 could help to enhance the entire matrix array structure strength. For any additional further process steps, the continuous structure could be sustained with no damage. For example, when applying a physical force to remove the substrate 10, the polymer could provide a continuous robust strength structure for the entire array sub-pixel light engines to prevent the damage/crack of hard materials (or called brittle materials). The hard material (or called brittle material) could be the epitaxy structure layer, the isolation layer 101, and the cured polymer 30. In addition, the air gap 40 could be a buffer to provide a buffer room for the entire matrix array structure more flexible to sustain the additional physical force.

Now referring to FIG. 7, and FIG. 9, the epi growth substrate 10 could be removed through different technologies. The removing of the growth substrate 10 could be performed through laser irradiation technology, substrate 10 grinding technology, chemical lift-off technology, and mechanical substrate 10 removal technology. Polymer 30 is to fix a shape of the semiconductor units 11 and buffer a stress of the semiconductor units 11.

For the laser irradiation technology, as the laser irradiate through the substrate 10 and interacting on the interface of the material underneath the substrate 10. The major portion of the interfacial materials underneath of the substrate 10 may be decomposed. In some particular case, some interfacial material underneath of the substrate 10 may stick on the substrate 10 without decomposition. In another particular case, some interfacial material underneath of the substrate 10 could be decomposed, but stick back to the substrate 10 after laser irradiation. Thus, after laser irradiation, the substrate 10 could be removed by applying additional physical force. After laser irradiation, there may remain some interfacial material still stick on the underneath of the substrate 10. For example, the image 1 interface layer could be decomposed by laser to be a metallic residue and a gas. The metallic residue could help the semiconductor light emitting unit still fixing on the substrate. The metallic residue is not a strong fixing material and could be peeled off by additional physical force. The image 2 interface layer could not be decomposed by laser and still well stick on the substrate. The image 3 and image 4 interface layer could be decomposed to carbon residue. The carbon residue could help the polymer still fixing on the substrate. The carbon residue is not a strong fixing material and could be peeled off by additional physical force. The continuous materials structure underneath of the interface of substrate 10 could connect and hold all the materials together as a completely compact connecting structure. The isolation layer 101, polymer 30, and the semiconductor light emitting unit could be completely protected by the completely compact connecting structure. The substrate 10 could be delaminated by applying additional physical force from the completely compact connecting structure. The isolation layer 101, polymer 30, and the semiconductor light emitting unit could be no change before and after applying laser irradiation and another physical force. The metallic residue and carbon residue could be then cleaned up by chemical solutions.

For the grinding substrate 10 technology, the grinding of substrate 10 has violent physical force to remove the substrate 10. The continuous materials structure underneath of the interface of substrate 10 could connect and hold all of the materials together as a completely connecting structure. The isolation layer 101, polymer 30, and the semiconductor light emitting unit could be completely protected by the completely compact connecting structure. The completely compact connecting structure underneath of the substrate 10 could provide enough strength to keep the whole structure more robust without damage during the violent grinding process.

For the chemical lift-off technology, the substrate 10 may be removed by violent chemical solution. The invented structure of FIG. 1, and FIG. 3 could provide a strong chemical resistant material underneath of the substrate 10. The initial growth epi layer, isolation layer 101 and the polymer 30 are continuous structure in the street region. When applying the chemical solution to remove the substrate 10, the continuous compact interfacial structure underneath of the substrate 10 could protect the entire structures of the semiconductor light emitting unit without chemical damaging.

For the mechanical lift-off substrate 10, a temporary layer could be initial grown on the substrate 10. The temporary layer is purposed to provide a mechanical lift off interfacial layer. After connecting the semiconductor light emitting unit to the backplane (driver), the substrate 10 could be removed by applying a strong physical force such as rotating or pulling up substrate 10 to delaminate the temporary layer. The continuous materials structure underneath of the interface of substrate 10 could connect and hold all of the materials together as a completely connecting structure. The isolation layer 101, polymer 30, and the semiconductor light emitting unit could be completely protected by the completely compact connecting structure. The invented structure of FIG. 1, and FIG. 3 with completely connecting structure underneath of the substrate 10 could provide a well supporting to prevent any mechanical damage.

Figure 11:
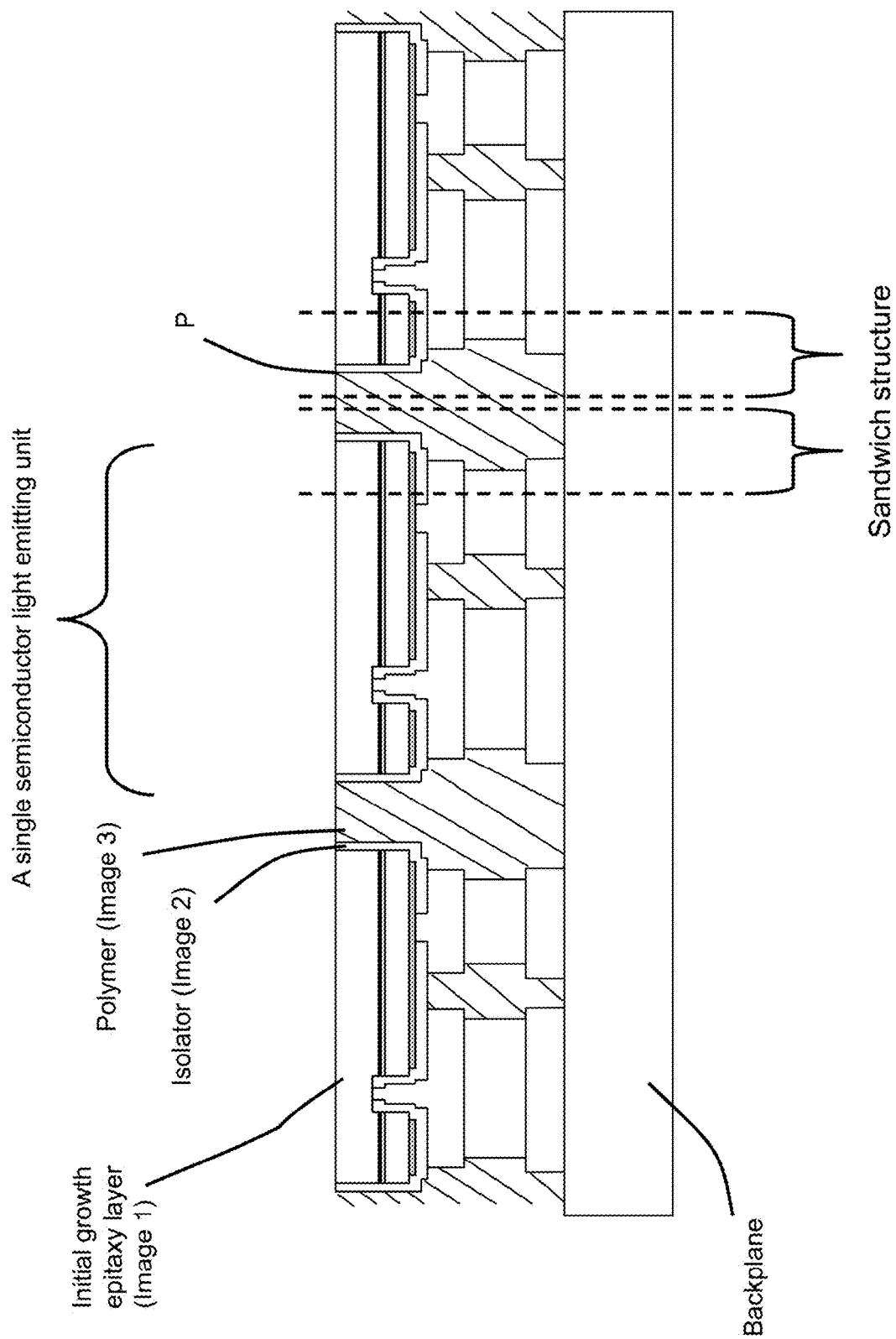
FIG. 11 is a schematic cross section diagram of FIG. 7 structure after removing the substrate.

FIG. 11 shows the scheme cross section structure of FIG. 7 after removing the substrate 10. The semiconductor light emitting units on the backplane (driver) could still perform three different images. The three different images are the Initial growth epitaxy layer (image 1), the isolation layer 101 (image 2), and the polymer 30 (image 3). Please note that the semiconductor light emitting units on backplane (driver) after substrate 10 removal has the same height of materials meaning that the image 1, image 2, and image 3 are at the same level. The same height materials could simplify additional fabricating process such as forming the color conversion layer on top of the semiconductor light emitting unit. The polymer 30 in the street region could be purposed as a function of black matrix of array to absorb, stop or reflect the light escaping from the edge of semiconductor light emitting unit and prevent the crosstalk effect. In some particular, the substrate 10 might not need to be removed. For rigid type monochrome display application, the non-transparent polymer 30 in the street region as a black matrix could prevent the light crosstalk issue.

Figure 12:
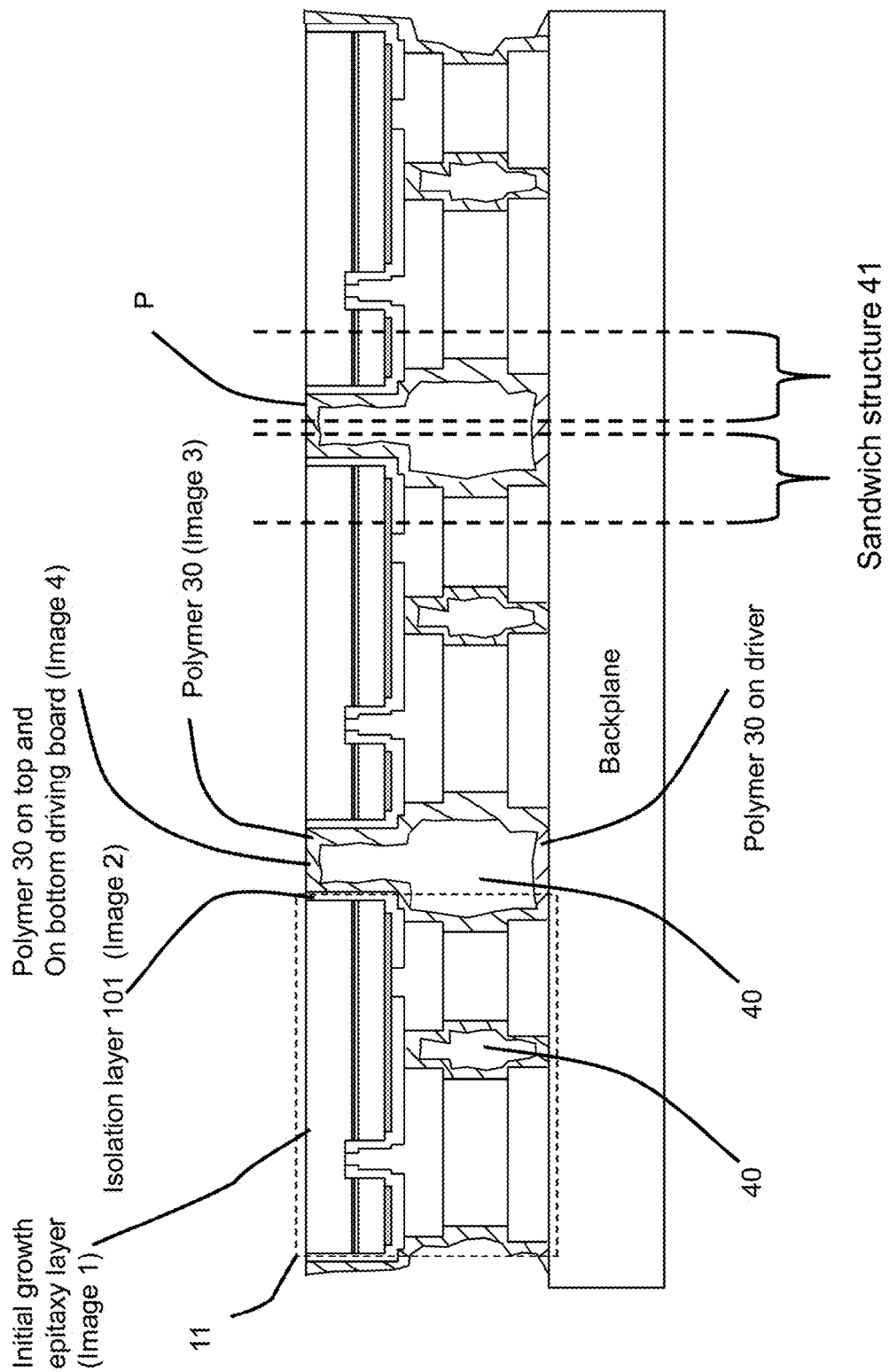
FIG. 12 is a schematic cross section diagram of FIG. 9 structure after removing the substrate.

FIG. 12 shows the scheme cross section structure of FIG. 9 after removing of the substrate 10. The semiconductor light emitting array units on backplane (driver) could still perform four different images. The four images are the Initial growth epitaxy layer (image 1), the isolation layer 101 (image 2), the polymer 30 in the edge region of the street covering the isolation layer 101 (image 3), the polymer 30 covering on top surface of the backplane (driver) could be reflected through the air gap 40 and mixing with the polymer 30 in the middle of the street (image 4). Please note that the semiconductor light emitting units on backplane (driver) after substrate 10 removal has the same height of materials, image 1, image 2, image 3, and image 4. The same height materials could simplify additional fabricating process. The polymer 30 in the street region could be purposed as a function of black matrix of array to absorb, stop or reflect the light escaping from the edge of semiconductor light emitting array unit and prevent the crosstalk effect. In some particular, the substrate 10 might not need to be removed. For rigid type monochrome display application, the non-transparent polymer 30 in the street region as a black matrix could prevent the light crosstalk issue.

In some particular application such as the curved able or flexible display application, the polymer 30 in the street could be provided as stretch properties to allow the bending force acting on the display matrix. In the structure of FIG. 11, and FIG. 12, the polymer 30 could be selected from the stretch materials, such as gels, glues, epoxy, polyimide, parylene, silicone, methyl-silicone, cohesive gels, silicone gels, PMMA, photosensitive resister, UV or thermal cure able glues. The stretch material described above could help to support the semiconductor light emitting array units and provide flex properties to prevent the crack or damage of hard materials in the structure. The hard materials such as the epitaxy structure, the isolation layer 101 are very thin in the structure. The semiconductor light emitting array unit as a pixel light engine unit with isolation layer 101 surrounding on the edge could be very hard and brittle materials. For application of curved or flexible display, the stretch property of polymer 30 could provide a well supporting to maintain the integrity for the structure of FIG. 11, and the structure of FIG. 12. For the curved and flexible display, additional physical force to bend the display is a fundamental requirement. The stretch polymer 30 could grip to clamp the semiconductor light emitting units and provide a flex buffer room to allow the bending force working on the semiconductor light emitting array units without damaging the structure. Please note that the size of the semiconductor light emitting unit are ranging from 0.5 µm to 1000 µm, the stretch polymer 30 allow a wide angle of bending for curved or flexible display application. During the bending action, the stretch polymer 30 could be extended well without separation.

In another embodiment, referring to FIG. 11, and FIG. 12, the street polymer 30 could be removed after removing the substrate 10. After removing substrate 10, top of the semiconductor light emitting units and the polymer 30 will form a flat plane P.

Figure 13:
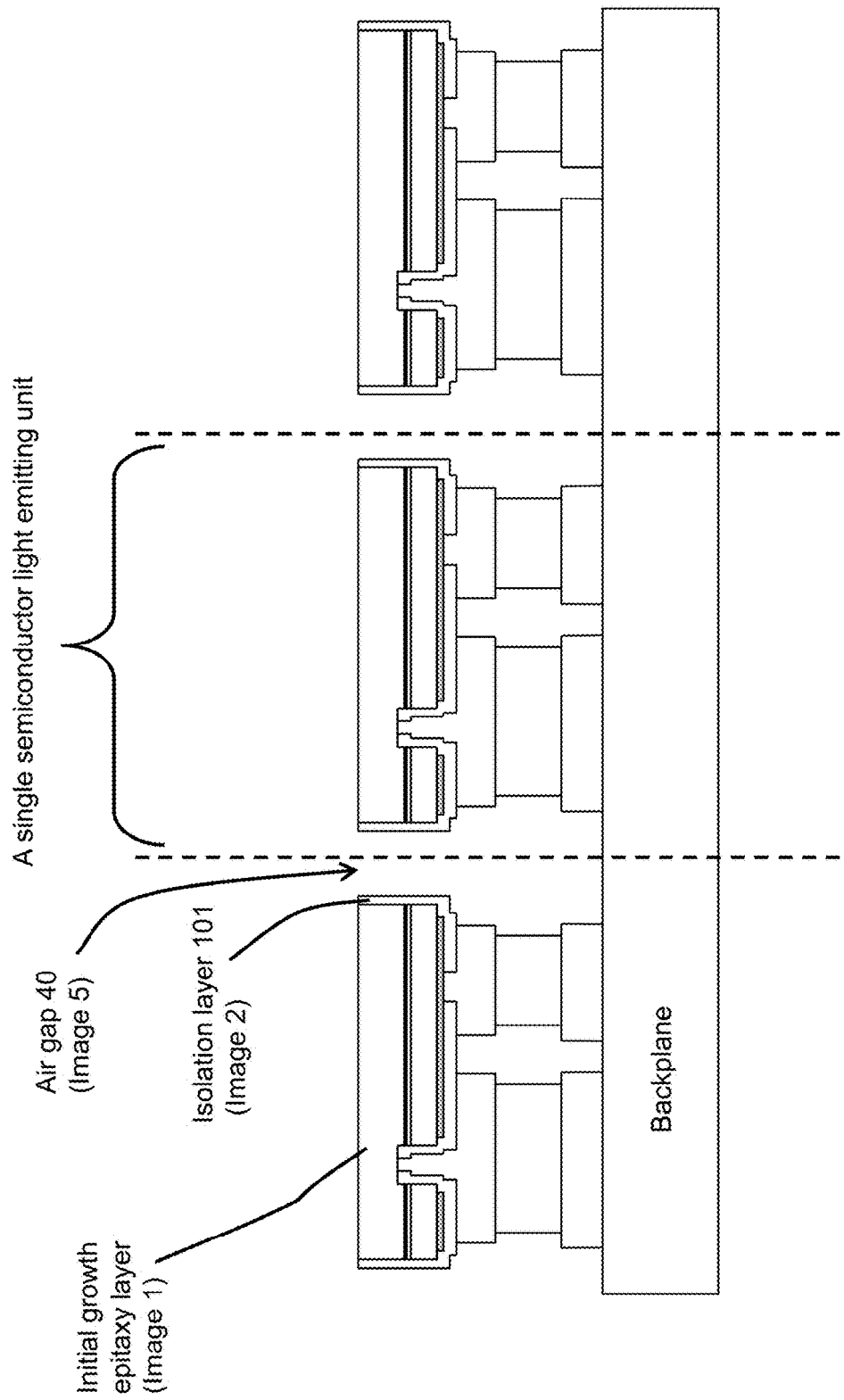
FIG. 13 is the separated semiconductor light emitting array units on the backplane (driver) after removing the substrate and polymer.

FIG. 13 shows the street polymer 30 is removed. Each semiconductor light emitting array unit could be separated only by an air gap 40 in the street. In FIG. 13, three images could be obtained from the top view. The initial growth epitaxy (image1), the isolation layer 101 (image 2), and the air gap (the backplane (driver) surface) (called image 5). For the low cost mono color display application, due to each semiconductor light emitting array units has isolation layer 101 covering and protecting, the mono color display module could be applied for some particular application.

Figure 14:
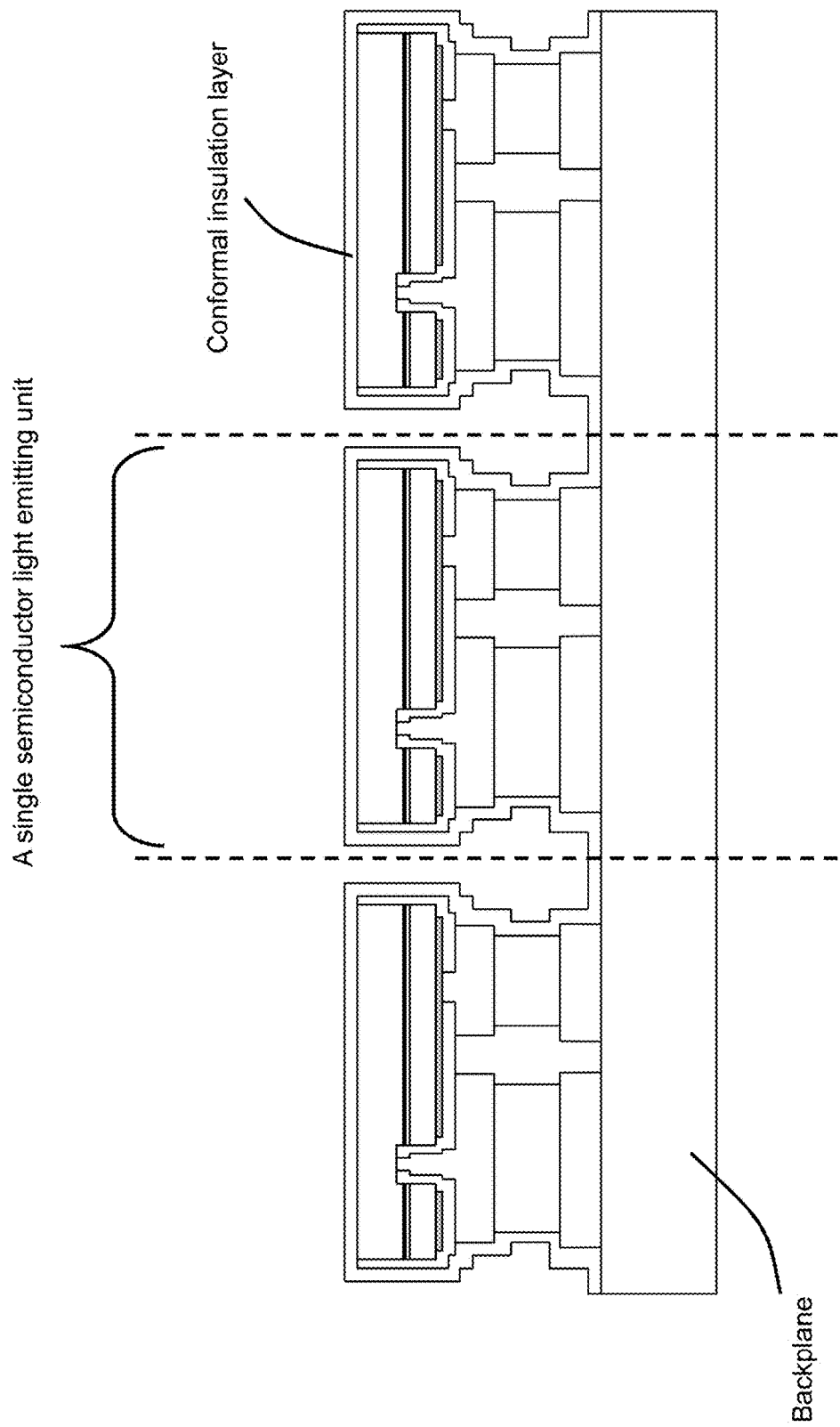
FIG. 14 is a scheme cross section diagram, showing a conformal insulation layer could be coated on the FIG. 13 structure.

In another embodiment, referring to FIG. 13, the empty street region and the top of the semiconductor light emitting array units could be formed an insulation layer as a passivation layer. The insulation layer could be a conformal layer selecting from depositing parylene, $SiN_x$, $SiO_2$ or other suitable passivation materials. FIG. 14 shows a conformal insulation layer could be coated on the FIG. 13 structure. In FIG. 14, the street region still remains an air buffer structure after conformal insulation layer coating. The FIG. 14 structure could be applied for flexible mono color display application.

Figure 15:
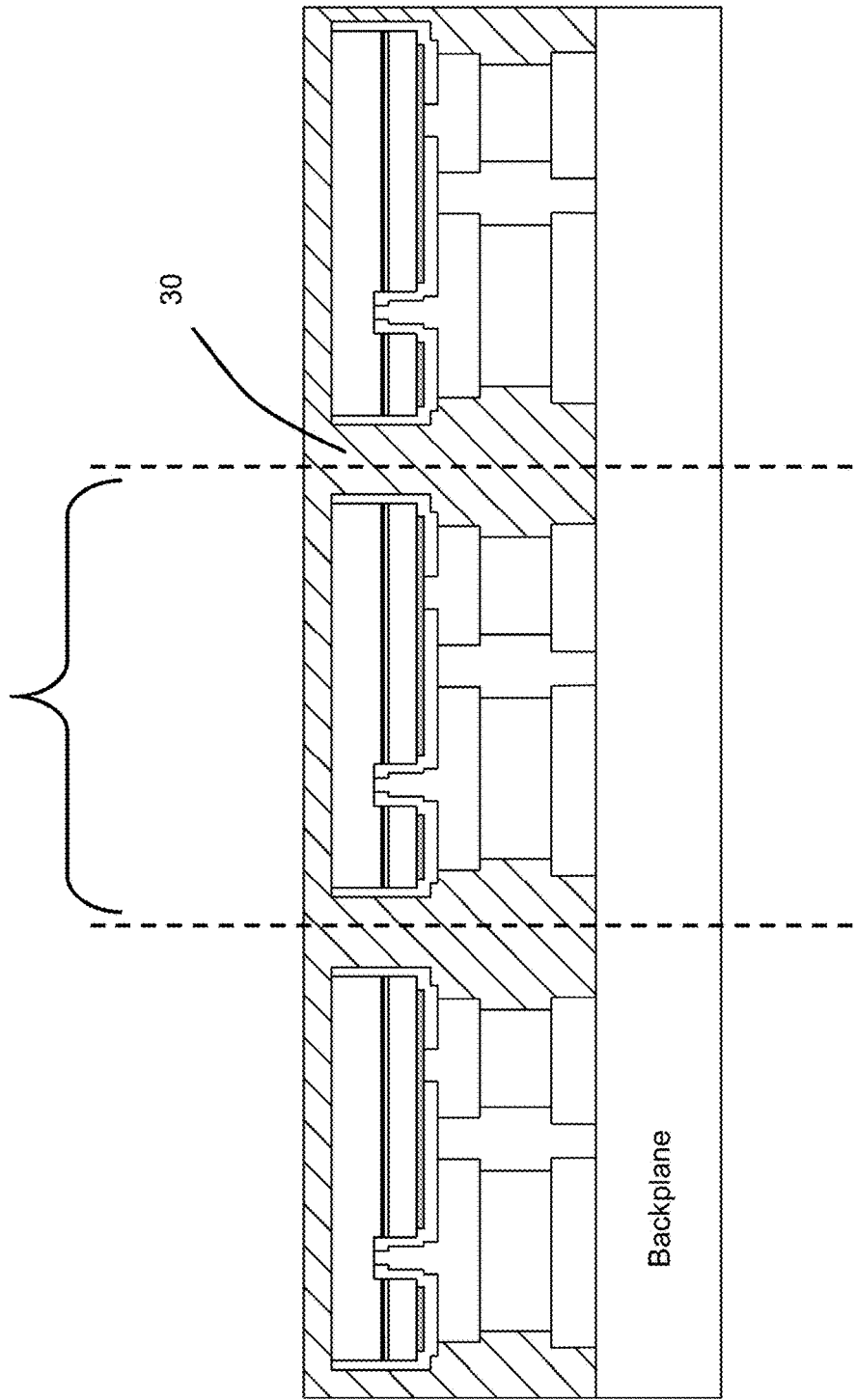
FIG. 15 is a schematic cross section diagram, showing an insulation polymer layer could be coated on the FIG. 13 structure.

In another embodiment, the passivation layer could be another polymer 30 layer coating on top of the semiconductor light emitting array unit and fill in the street region. FIG. 15 shows a polymer 30 layer coated on the FIG. 13 structure. The entire FIG. 15 structure could keep a flat top surface for further process steps. Please note that the thickness of the polymer 30 layer should be better selected to be less than 10 µm to prevent the waveguide effect the light emitted from the sub-pixel light engine light guiding to the neighbor sub-pixel region. For the flexible display application, the backplane (driver) is flexible and could be selected from polyimide, plastic, thin glass. The covering polymer 30 of FIG. 15 structure could be selected from stretch material such as gels, glues, epoxy, polyimide, parylene, silicone, methyl-silicone, cohesive gels, silicone gels, PMMA, photosensitive photoresist, UV or thermal cure able glues.

Figure 16A:
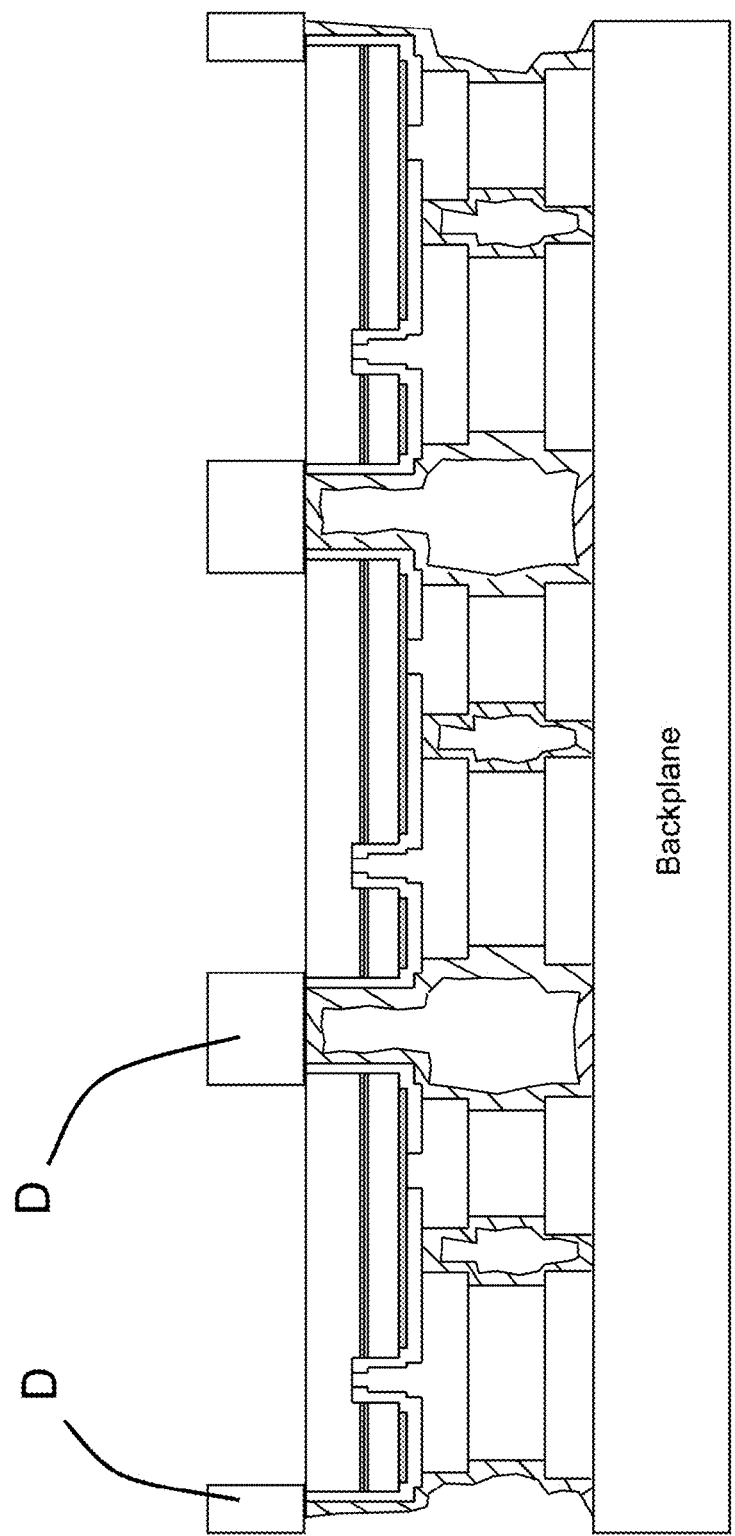
FIG. 16A is a schematic cross section diagram of a dam array patterning on top of the FIG. 12 structure.
Figure 16B:
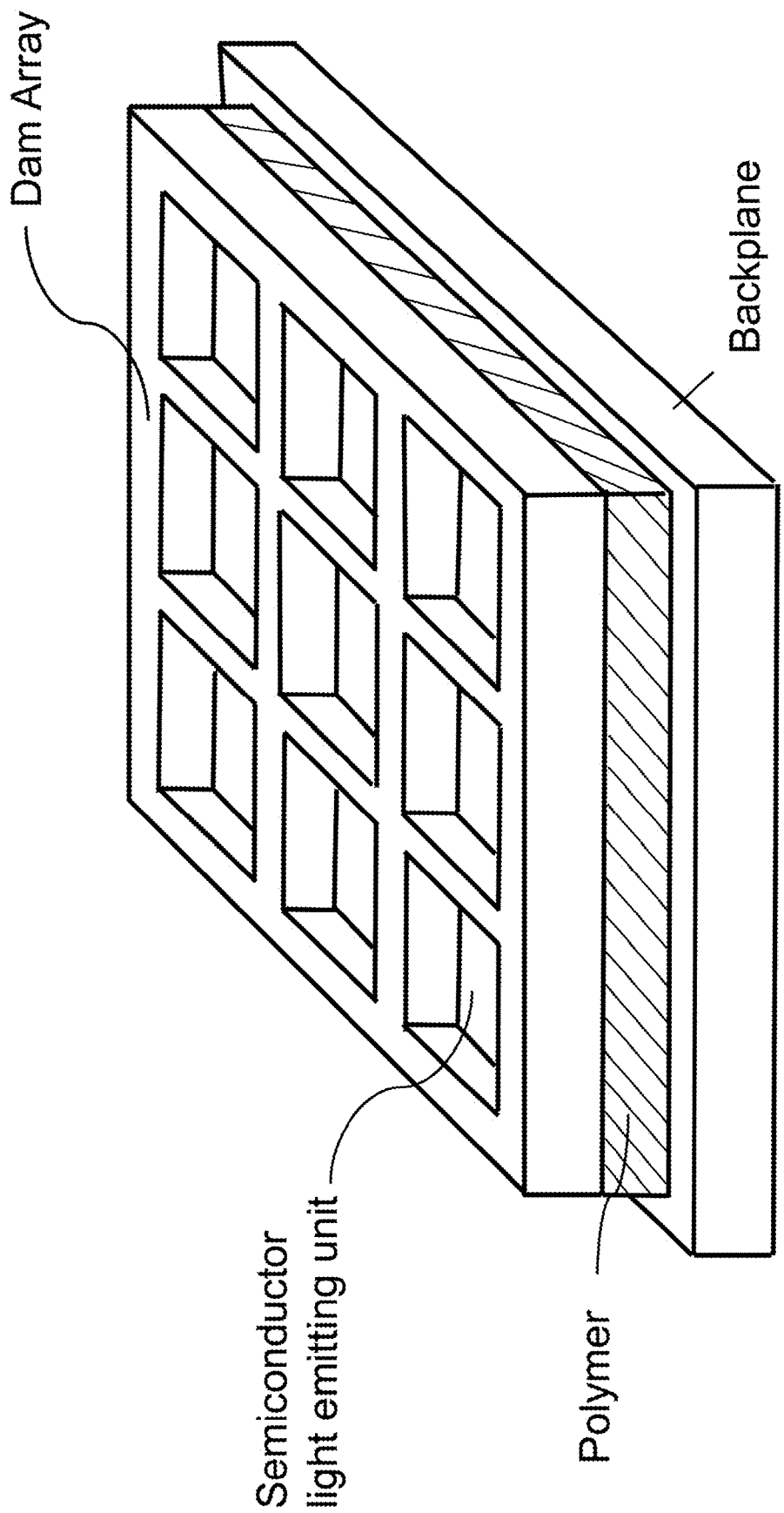
FIG. 16B is a schematic view showing a three dimensional view of FIG. 16A.

For the application of full color display, the color conversion layers could be patterning on top of the FIG. 11, FIG. 12, FIG. 13, FIG. 14, and FIG. 15 structure in each one semiconductor light emitting array unit. In one embodiment, a dam array could be first formed on top of the street region of FIG. 12 structure. FIG. 16 shows a dam array could be directly patterned on top surface of the flat street of FIG. 12 structure. FIG. 16B is a schematic view showing a three dimensional view of FIG. 16A. Multiple dams D set on the flat plane and top of the polymer to combine a dam array. The dam array could be as a black matrix to distinguish the light from each semiconductor light emitting array unit. The dam array could be deposited on top flat surface to cover the polymer 30, isolator, and a portion of n-type layer. Please note that the dam array could be only selected forming on top of the polymer 30 within the street. The dam array could be patterned through black dyeing photoresist, or could be patterned by metal deposition.

Figure 17:
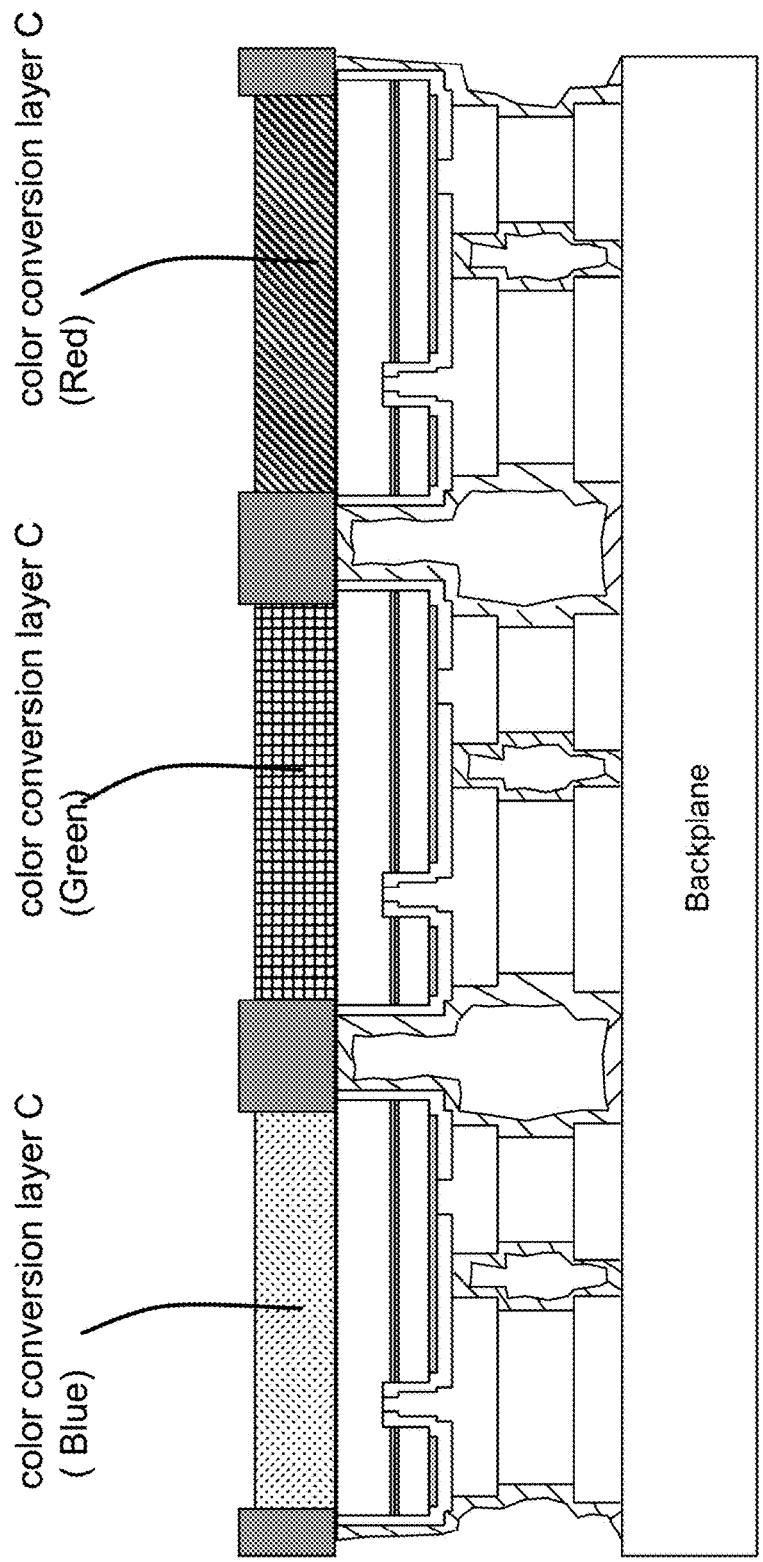
FIG. 17 is a schematic cross section diagram of color conversion layer patterning on the structure of FIG. 16 in accordance with UV emitted semiconductor light emitting array unit.

FIG. 17 shows a different color conversion (wavelength conversion) layers could be formed in the dam directly on top of the FIG. 16A structure. Multiple color conversion layers C set on the flat plane P and filled in the dam array to convert the light of semiconductor light emitting units from the a first spectrum to a second spectrum. In the case of UV semiconductor light emitting array units as a sub-pixel light engine, a blue conversion layer could be proportion patterned inside the dam on top of the n-type layer of the UV semiconductor light emitting array unit, a green conversion layer could be proportion patterned inside the dam on top of the n-type layer of the UV semiconductor light emitting array unit, and a red conversion layer could be proportion patterned inside the dam on top of the n-type layer of the UV semiconductor light emitting array unit.

The color conversion layers could be formed by using selective color converting phosphors, selective color converting quantum dots, and other materials having the various color converting properties. The patterning of the color converters could be formed by mixing phosphors or QDs with photo-sensitive polymer 30 for photolithography. The photo-sensitive polymer 30 could be photo-sensitive silicone, photo-sensitive PMMA, photo-sensitive polyimide, photo-sensitive epoxy, photo-sensitive gels, gules. The patterning of the color conversion layers could be fabricated by photolithography, micro screen printing, micro jetting, micro inkjet printing, micro contacting printing, micro dispensing, nano-imprinting, self-assembly, or other lithographic and photolithographic technologies.

To convert the UV emission semiconductor light emitting array units for full color application, the color conversion layers could be a color phosphor. The color phosphor could be selected to be micro and sub-micro size mixing with polymer for better color uniformity. The color phosphor for example could be selected from the material such as $Ca_2PO_4Cl:Eu^{2+}$, $RbBaPO^4:Eu^{2+}$ (RBP) phosphor for blue color conversion. The color phosphor for example could be selected from the material such as $(Ca, Sr, Ba,)_2(Mg, Zn)Si_2O_7:Eu$, $(Ba,Sr_2SiO_4:Eu^{2+}$ phosphor for green color conversion. The color phosphor for example could be selected from the material such as $Sr_2Si_5N_8$, $CaAlSiN_3:Eu$ phosphor for red color conversion. To convert the BLUE emission semiconductor light emitting array units for full color application, the wavelength conversion layer could be a color phosphor. The color phosphor could be selected to be sub-micro size mixing with polymer for better color uniformity. The color phosphor for example could be selected from the material such as (Sr, Ga, Ba)S:Eu, SrSiON:Eu phosphor for green color conversion. The color phosphor for example could be selected from the material such as (SrCa)AlSiN$_3$:Eu, (Ca, Sr, Ba)S:Eu phosphor for red color conversion. The red (R) phosphor, green (G) phosphor, blue (B) phosphor could be proportionally patterning and filling by using micro dropping, micro dispensing, micro screen printing, direct self-assembly, micro contacting printing, micro inkjet printing, or other lithographic and photolithographic technologies.

The color conversion layers could be selected from Blue, Green, and Red quantum dots (QDs). The color converter material could be formed by size selective quantum dots (QDs) in polylaurylmethacrylate (PLMA) or polymethyl methacrylate (PMMA). For example, the QDs can be selected from CdSe/ZnS. The CdSe/ZnS/CdSZnS QDs for green conversion layer, and CdSe/CdS/ZnS/CdSZnS for red color conversion layer. The fill in process could be done by using micro dropping, micro dispensing, micro screen printing, direct self-assembly, micro contacting printing, micro inkjet printing, or other lithographic and photolithographic technologies.

The color conversion layers could be selected from mixing polymer, full color spectrum phosphor, and color filter photoresist. The color filter photoresist could be selected from red, green, and blue colors. When the UV or blue light hit the full color spectrum phosphor, the light could be converted to a full color spectrum. The full color spectrum light will be absorbed by the color filter photoresist. The full color spectrum light will only emit the color of its color filter spectrum. For example of mixing red color filter photoresist, the full color spectrum light after phosphor will only emit the red color.

In another embodiment, the semiconductor light emitting array units could be the blue light emitting emission spectrum as the sub-pixel light engine. The blue conversion layer in FIG. 17 could be replaced to a transparent material.

In some particular case, the structure of FIG. 17 could be fabricated by using another embodiment, the dam array and the color conversion (wavelength conversion) layers could be first formed on another transparent material (not shown in here). The patterning color wavelength conversion layers and the dam array could be formed on the transparent material. The transparent material having patterning color conversion layers and dam array could be then aligned and mounted onto the semiconductor light emitting array unit to provide a full color display.

Thus the disclosure describes the method, and structure for fabricating a continuous array cross-sectional sandwich structure for semiconductor chip array transforming and examples for semiconductor light emitting array unit for display application. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A structure of a compound semiconductor light emitting display array comprising:
    a backplane driver, wherein the backplane driver having a first surface and a second surface;
    a plurality of compound semiconductor light emitting unit disposed in an array on the first surface of the backplane driver having a gap between any two adjacent ones,
    wherein the each compound semiconductor light emitting unit having a first surface and a second surface,
    wherein the second surface of the each compound semiconductor light emitting unit having a cathode and an anode, and wherein the cathode and the anode of the each compound semiconductor light emitting unit electrically connected to the first surface of the backplane driver;
    a dam array aligned over the gap wherein the dam array having openings located above the first surface of the each compound semiconductor light emitting unit and wherein the each opening is aligned to the each compound semiconductor light emitting unit; and
    wherein the cathode and the anode of the each compound semiconductor light emitting unit are separated from each other and electrically isolated from the adjacent electrodes of the adjacent compound semiconductor light emitting units by a polymer material and an air gap surrounded by the polymer material.

2. The structure of the compound semiconductor light emitting display array according to claim 1, wherein the each compound semiconductor light emitting unit surrounded by a street region is electrically isolated from adjacent compound semiconductor units by an isolation layer.

3. The structure of the compound semiconductor light emitting display array according to claim 1, wherein the each compound semiconductor light emitting unit is connected to the adjacent compound semiconductor unit via the polymer material in the street region.

4. The structure of the compound semiconductor light emitting display array according to claim 1, wherein the backplane driver has integrated circuitries comprising data lines and scan lines and each compound semiconductor light emitting unit being controlled individually to display an image.

5. The structure of the compound semiconductor light emitting display array according to claim 1, wherein the each opening having a size substantially the same as a size of the each compound semiconductor light emitting unit.

6. The structure of the compound semiconductor light emitting display array according to claim 1, wherein the each opening containing a color conversion layer.

7. The structure of the compound semiconductor light emitting display array according to claim 1, wherein the cathode and anode of the each compound semiconductor light emitting unit are bonded to the backplane driver by soldering.

* * * * *